US008212812B2

(12) United States Patent
Tsin et al.

(10) Patent No.: US 8,212,812 B2
(45) Date of Patent: Jul. 3, 2012

(54) ACTIVE SHAPE MODEL FOR VEHICLE MODELING AND RE-IDENTIFICATION

(75) Inventors: Yanghai Tsin, Plainsboro, NJ (US); Yakup Genc, Dayton, NJ (US); Visvanathan Ramesh, Plainsboro, NJ (US)

(73) Assignee: Siemens Corporation, Iselin, NJ (US)

( * ) Notice: Subject to any disclaimer, the term of this patent is extended or adjusted under 35 U.S.C. 154(b) by 1056 days.

(21) Appl. No.: 12/122,800

(22) Filed: May 19, 2008

(65) Prior Publication Data

US 2008/0294401 A1 Nov. 27, 2008

Related U.S. Application Data

(60) Provisional application No. 60/939,134, filed on May 21, 2007.

(51) Int. Cl.
*G06T 17/00* (2006.01)
(52) U.S. Cl. .......................................... 345/420; 345/582
(58) Field of Classification Search .................. 345/420, 345/582
See application file for complete search history.

(56) References Cited

U.S. PATENT DOCUMENTS

2005/0200623 A1* 9/2005 Smith et al. .................... 345/419
2006/0188131 A1 8/2006 Zhang et al.

OTHER PUBLICATIONS

Bramberger et al. "Distributed Embedded Smart Cameras for Surveillance Applications" Graz University of Technology, IEEE Computer Society, 2006 pp. 70 and 73.*
Mueller et al. "Multi-Texture Modeling of 3D Traffic Scenes" 2003 International Conference on Multimedia and Expo—vol. 1 (ICME '03), 2003 pp. 657-659.*
Avidan "Support Vector Tracking" IEEE Transactions on Pattern Analysis and Machine Intelligence, vol. 26, No. 8, Aug. 2004 p. 1064.*
Trivedi et al. "Distributed Interactive Video Arrays for Event Based Analysis of Incidents" 5th International IEEE Conference on Intelligent Transportation Systems, Singapore, Sep. 2002 p. 3.*
T.F. Cootes, C.J. Taylor, D.H. Cooper, and J. Graham. Active shape models—their training and application. Computer Vision and Image Understanding, 61(1):38-59, Jan. 1995.
X.S. Zhou, D. Comaniciu, and A. Gupta. An information fusion framework for robust shape tracking. PAMI, 27 (1):115-129, 2005.
V. Blanz and T. Vetter. Face recognition based on fitting a 3d morphable model. PAMI, 25(9):1063-1074, 2003 and J. Xiao, S. Baker, I. Matthews, and T. Kanade. Real-time combined 2D+3D active appearance models. In CVPR, 2004.
R.Y. Tsai. A versatile camera calibration technique for high-accuracy 3D machine vision metrology using off-the-shelf TV cameras and lenses. IEEE Journal of Robotics and Automation, RA-3(4):323-344, Aug. 1987.

(Continued)

*Primary Examiner* — Maurice L McDowell, Jr.
(74) *Attorney, Agent, or Firm* — Donald B. Paschburg; F. Chau & Associates, LLC

(57) ABSTRACT

A method for modeling a vehicle, includes: receiving an image that includes a vehicle; and constructing a three-dimensional (3D) model of the vehicle, wherein the 3D model is constructed by: (a) taking a predetermined set of base shapes that are extracted from a subset of vehicles; (b) multiplying each of the base shapes by a parameter; (c) adding the resultant of each multiplication to form a vector that represents the vehicle's shape; (d) fitting the vector to the vehicle in the image; and (e) repeating steps (a)-(d) by modifying the parameters until a difference between a fit vector and the vehicle in the image is minimized.

21 Claims, 22 Drawing Sheets

OTHER PUBLICATIONS

A. Boffy, Y. Tsin, and Y. Genc. Real-time feature matching using adaptive and spatially distributed classification trees. In British Machine Vision Conference, 2006.

Y. Tsin, Y. Genc, and V. Ramesh. A very fast and jitter-free tracker by model-guided detection and matching, unpublished.

Y. Tsin, Y. Genc, Y. Zhu, and V. Ramesh. Learn to track edges. Accepted for Oral Presentation on the Eleventh IEEE International Conference on Computer Vision 2007 (ICCV'07).

J. Xiao, S. Baker, I. Matthews, and T. Kanade. Real-time combined 2D+3D active appearance models. In CVPR, 2004.

Y. Guo, S. Hsu, Y. Shan, H. Sawhney, and R. Kumar. Vehicle fingerprinting for reacquisition & tracking in videos. Computer Vision and Pattern Recognition, 2005. CVPR 2005. IEEE Computer Society Conference on vol. 2, Issue , Jun. 20-25, 2005 pp. 761-768.

Y. Shan, H. Sawhney, and R. Kumar. Unsupervised learning of discriminative edge measures for vehicle matching between non-overlapping cameras. Pattern Analysis and Machine Intelligence, IEEE Transactions on vol. 30, Issue 4, Apr. 2008 pp. 700-711.

Y. Shan, H. Sawhney, and R. Kumar. Vehicle identification between non-overlapping cameras without direct feature matching. Computer Vision, 2005. ICCV 2005. Tenth IEEE International Conference on Publication Date: Oct. 17-21, 2005 vol. 1, pp. 378-385.

* cited by examiner (a)

(b)

(c)

(a)

(b)

(c)

ACTIVE SHAPE MODEL FOR VEHICLE MODELING AND RE-IDENTIFICATION

CROSS-REFERENCE TO RELATED APPLICATION

This application claims the benefit of U.S. Provisional Application No. 60/939,134, filed May 21, 2007, the disclosure of which is incorporated by reference herein in its entirety.

BACKGROUND OF THE INVENTION

1. Technical Field

The present invention relates to vehicle modeling and re-identification.

2. Discussion of the Related Art

In general, object shapes are complex. Shape representation has consistently been a challenge to computer vision applications. However, for the same class of objects, e.g., human faces, the variability is considerably smaller than the ensemble of all object shapes. Thus, it is possible to statistically model the shape of a certain class. A successful approach in this area is the so-called active shape model (ASM) [T. F. Cootes, C. J. Taylor, D. H. Cooper, and J. Graham. Active shape models—their training and application. Computer Vision and Image Understanding, 61(1):38-59, January 1995]. The essence of an ASM is that an object class can be modeled by an average shape plus a small set of allowed variations. We now illustrate this point more precisely.

For instance, an object shape can be represented by a set of three-dimensional (3D) points $x_n$, n=1, 2, ..., N. These points can be a point cloud representation for a surface of an object, vertices of a triangular mesh, or points corresponding to edges defined by geometric discontinuities, high curvature regions and those defined by sharp surface reflectance changes. We can stack the points together and form a length 3N dimensional vector x $$x = [x_1^T, x_2^T, \ldots, x_N^T]^T, \quad (1)$$

where $^T$ means transpose of a vector. Suppose that we have K samples from an object class, e.g., K different faces, we can have K such shape vectors $x^{(k)}$, k=1, 2, ..., K. We assume that the same elements in two different vectors correspond. For example, the first element of two shape vectors $x^{(1)}$ and $x^{(2)}$ are both X coordinates of two person's nose tips. An ASM is thus represented by a mean shape m and a set of M variability vectors $v_m$, m=1, 2, ..., M. The mean shape m and the variability vectors are learned from the set of training samples and are fixed once learned. The variability of the shapes comes from a control vector $\lambda$. Once determined, the shape of an object instance can be approximated by $$x \approx f(m, V, \lambda), \quad (2)$$

where $V = \{v_1, v_2, \ldots, v_M\}$ is the set of variability vectors and f is the shape assembly function.

A simple case of the ASM is the linear ASM, where the shape assembly is simply a linear combination of the variability vectors and the mean shape, $$x = m + V \cdot \lambda, \quad (3)$$

where by abusing symbols we write the shape variability matrix as $V = [v_1, v_2, \ldots, v_M]$. A convenient and effective way to build an ASM is by principle component analysis (PCA). That is, $$m = \frac{1}{K} \sum_{k=1}^{K} x^{(k)} \quad (4)$$

and we take $v_m$ as the first M eigenvectors (corresponding to the largest M eigenvalues) of the (semi-)definite symmetric matrix $$\sum_{k=1}^{K} (v_k - m)(v_k - m)^T \quad (5)$$

To extract meaningful ASMs we usually require that K>>M.

Note that a prior distribution on the control parameters $\lambda$ can be learned from the samples as well. A Gaussian prior is usually assumed on the control parameters, $$\lambda \sim N(\mu_\lambda, \Sigma_\lambda). \quad (6)$$

For the linear ASM, $\mu_\lambda$ is a zero vector and $\Sigma_\lambda$ is diagonal.

In the physical world, there is no guarantee that shape variability of an object class can be captured accurately by a linear ASM. However, besides convenience there are a few important reasons for adopting PCA ASM. First, a PCA ASM captures the majority of the shape variability. Given enough variability vectors $v_m$, the approximation can be very accurate. Second, it is a convenient way of navigating through the space of infinitely many object shapes in a class. A linear model has the advantage that the optimal shape control vectors can be globally found by solving a least squares optimization problem.

ASMs have seen a great deal of success in computer vision applications, such as medical image processing [X. S. Zhou, D. Comaniciu, and A. Gupta. An information fusion framework for robust shape tracking. PAMI, 27(1): 115-129, 2005] and face tracking and modeling [V. Blanz and T. Vetter. Face recognition based on fitting a 3d morphable model. PAMI, 25(9):1063-1074, 2003 and J. Xiao, S. Baker, I. Matthews, and T. Kanade. Real-time combined 2D+3D active appearance models. In CVPR, 2004]. However, we have not seen applications of ASM to true 3D objects such as the class of consumer vehicles. There are a few reasons for this. First, an ASM is relatively easy to build from mostly 2D objects such as a slice of a CT/ultrasonic scan or mostly frontal views of human faces. The cases for vehicles are quite different. A vehicle can potentially be viewed from any angle and the vehicle shapes can look drastically different from two different angles. Second, aligning a vehicle ASM with an image observation is considerably more difficult. Unlike the face model where a low dimensional appearance model can be extracted from a set of training images, the appearance of the vehicles varies unpredictably as a function of surface material type, color, as well as the environment radiance map. In the case of face tracking and modeling, an ASM is usually combined with a PCA appearance model to form an active appearance model (AAM). Model/image registration is relatively easy by minimizing the sum of squared difference (SSD) between an observed image and a synthesized image. However, this is not the case for cars. Third, the shapes of vehicles are quite different from one another. Just imagine the differences among a pickup truck, a passenger sedan and a minivan. The shape variability poses huge challenges for both shape representation and matching models with images.

Accordingly, there exists a need for a technique of applying an ASM to true 3D objects such as the class of consumer vehicles.

SUMMARY OF THE INVENTION

In an exemplary embodiment of the present invention, a method for modeling a vehicle, comprises: receiving an image that includes a vehicle; and constructing a three-dimensional (3D) model of the vehicle, wherein the 3D model is constructed by: (a) taking a predetermined set of base shapes that are extracted from a subset of vehicles; (b) multiplying each of the base shapes by a parameter; (c) adding the resultant of each multiplication to form a vector that represents the vehicle's shape; (d) fitting the vector to the vehicle in the image; and (e) repeating steps (a)-(d) by modifying the parameters until a difference between a fit vector and the vehicle in the image is minimized.

The base shapes are extracted by applying principle component analysis to vectors of landmark points, wherein each vector of landmark points represents a vehicle in the subset.

A parameter is a linear interpolation coefficient.

The parameters are found using a search algorithm. The search algorithm is a gradient descent.

In an exemplary embodiment of the present invention, a method for re-identifying a vehicle, comprises: capturing an image that includes a first vehicle; constructing a 3D model of the vehicle, wherein the 3D model is constructed by: (a) taking a predetermined set of base shapes that are extracted from a subset of vehicles; (b) multiplying each of the base shapes by a parameter; (c) adding the resultant of each multiplication to form a vector that represents the vehicle's shape; (d) fitting the vector to the vehicle in the image; and (e) repeating steps (a)-(d) by modifying the parameters until a difference between a fit vector and the vehicle in the image is minimized; capturing an image that includes a second vehicle; constructing a 3D model of the second vehicle, wherein the 3D model of the second vehicle is constructed by performing steps (a)-(e); and determining if the 3D model of the first vehicle is the same as the 3D model of the second vehicle by comparing the 3D models to each other.

The method further comprises: extracting color information from the vehicles in the images; and applying the color information to the respective 3D models.

The step of determining if the 3D model of the first vehicle is the same as the 3D model of the second vehicle further comprises comparing the colored 3D models to each other.

The method further comprises: extracting environmental condition information of an area surrounding each of the vehicles in the images; and applying the environmental condition information to the respective colored 3D models.

When the environmental condition information is different, the method further comprises equalizing an effect of the environmental conditions on the colored 3D models.

The method further comprises: extracting texture information from the vehicles in the images; and applying the texture information to the respective 3D models.

The step of determining if the 3D model of the first vehicle is the same as the 3D model of the second vehicle further comprises comparing the textured 3D models to each other.

The method further comprises: extracting environmental condition information of an area surrounding each of the vehicles in the images; and applying the environmental condition information to the respective textured 3D models.

When the environmental condition information is different, the method further comprises equalizing an effect of the environmental conditions on the colored 3D models.

The method further comprises categorizing the 3D models.

In an exemplary embodiment of the present invention, a method for performing shape based control, comprises: receiving an image that includes a vehicle; and constructing a 3D model of the vehicle, wherein the 3D model is constructed by: (a) taking a predetermined set of base shapes that are extracted from a subset of vehicles; (b) multiplying each of the base shapes by a parameter; (c) adding the resultant of each multiplication to form a vector that represents the vehicle's shape; (d) fitting the vector to the vehicle in the image; and (e) repeating steps (a)-(d) by modifying the parameters until a difference between a fit vector and the vehicle in the image is minimized; identifying a desired portion of the vehicle for further analysis; and causing another image that includes the vehicle to be taken, wherein the image further includes an enhanced version of the desired portion.

The images are captured from one or more than one camera.

In an exemplary embodiment of the present invention, a system for re-identifying a vehicle, comprises: a first camera for capturing an image that includes a first vehicle; a second camera for capturing an image that includes a second vehicle; and a computer in communication with the cameras, the computer including a memory device for storing a program and a processor in communication with the memory device, the processor operative with the program to: receive the image that includes the first vehicle; construct a 3D model of the vehicle, wherein the 3D model is constructed by: (a) taking a predetermined set of base shapes that are extracted from a subset of vehicles; (b) multiplying each of the base shapes by a parameter; (c) adding the resultant of each multiplication to form a vector that represents the vehicle's shape; (d) fitting the vector to the vehicle in the image; and (e) repeating steps (a)-(d) by modifying the parameters until a difference between a fit vector and the vehicle in the image is minimized; receive the image that includes the second vehicle; construct a 3D model of the second vehicle, wherein the 3D model of the second vehicle is constructed by performing steps (a)-(e); and determine if the 3D model of the first vehicle is the same as the 3D model of the second vehicle by comparing the parameters of the 3D models to each other.

The first and second cameras are in different locations.

The first and second cameras communicate with the computer over a wired or wireless network.

In an exemplary embodiment of the present invention, a computer readable storage medium storing instructions that, when executed by a computer, cause the computer to perform a method for modeling a vehicle, the method comprising: receiving an image that includes a vehicle; and constructing a 3D model of the vehicle, wherein the 3D model is constructed by: (a) taking a predetermined set of base shapes that are extracted from a subset of vehicles; (b) multiplying each of the base shapes by a parameter; (c) adding the resultant of each multiplication to form a vector that represents the vehicle's shape; (d) fitting the vector to the vehicle in the image; and (e) repeating steps (a)-(d) by modifying the parameters until a difference between a fit vector and the vehicle in the image is minimized.

The foregoing features are of representative embodiments and are presented to assist in understanding the invention. It should be understood that they are not intended to be considered limitations on the invention as defined by the claims, or limitations on equivalents to the claims. Therefore, this summary of features should not be considered dispositive in determining equivalents. Additional features of the invention will become apparent in the following description, from the drawings and from the claims.

DETAILED DESCRIPTION OF EXEMPLARY EMBODIMENTS

Figure 1:
FIG. 1 illustrates two edge types (a) and (b) used for a coupled vehicle active shape model (ASM) according to an exemplary embodiment of the present invention and the two edges types drawn together with their mirror reflected parts (c)
Figure 1:
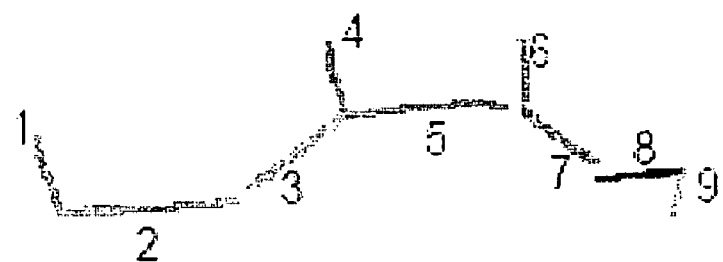
Figure 1:
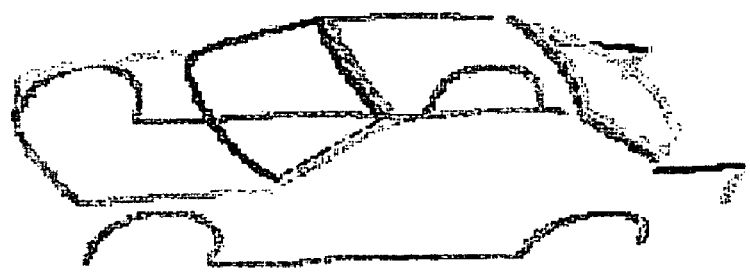

In accordance with an exemplary embodiment of the present invention, we extend the active shape model (ASM) to registration and modeling of vehicles from a single image. The practical difficulty in the extension comes from the large variability in the vehicle shapes, surface colors, and the non-Lambertian material types. We use an edge feature based representation due largely to its robustness to illumination changes. We exploit two kinds of edges, the surface markings (texture, surface discontinuity, etc.) and high curvature regions that are most likely to be an occluding contour from many different views. We couple the two types of features in a single ASM for both accuracy and robustness. Surface markings provide accuracy, while contour segments provide robustness against large errors in initial pose and vehicle shape estimation. The method is shown to be able to simultaneously register and model a large variety of vehicles.

1. Building a Coupled Vehicle ASM 1.1 Salient Edge Features in a Vehicle Image

We represent the class of vehicles by edge models. Though the cars may have different shapes and surface material types, there are some edge features that occur repeatedly in images of different views of all vehicle types. Our three-dimensional (3D) ASM is an ensemble of these features. We consider two types of such features.

The first type of edge features are those that correspond to surface discontinuity, sharp surface orientation change and/or change in surface material type/reflectance. These are persistent, observer independent physical characteristics of an object. They consistently appear on a 3D model and are view independent. We term them surface markings. We adopt three segments of surface markings in our ASM, namely, 1) the front windshield, 2) the side-bottom frame of a vehicle, and 3) the rear windshield. See FIG. 1(a) for an illustration. Note that due to symmetry of the vehicles, we only build ASMs for half of a vehicle. The other half can be conveniently retrieved by mirror reflection. There are of course other salient features on a vehicle, such as the headlight/taillight, side windows, etc. However, the variability of such features is too big to be put in the general class of vehicle types. They can be considered in a more detailed hierarchical ASM which will be discussed in section 1.4.

The surface marking features are represented as 3D edge points in our model (a group of 3D points with a tangent direction). The characteristics of this group of features is that their projections into images can be accurately located given a known model and camera parameters. They are crucial in accurately locating and modeling vehicles in an input image.

The second type of edge features are contours generated by projecting a smooth object into an image. Unlike surface markings, these features are viewing direction and imaging device dependent. The corresponding 3D points on the object vary from view to view and cannot be marked by landmarks on a local surface patch. In this section of the disclosure, we build ASMs using a special group of contour features: those features having large enough local mean curvatures to be repeatedly observed from many viewing angles, but not large enough to be considered as a surface marking. We adopt nine segments (parts) of such edge features: Namely, 1) hood front; 2) hood side; 3) front windshield side; 4) front windshield top; 5) roof side; 6) rear windshield top; 7) rear windshield side; 8) horizontal side of a trunk; and 9) vertical side of a trunk. See FIG. 1(b) for an illustration. We term this group of features contours. To avoid unnecessary introduction of different terminologies for the same concept. we refrain from calling them quasi-contours or the like, for now.

The contour features are represented by 3D edge features in our ASM as well. However, we must bear in mind that they are not accurate 3D edge features. Their actual projections in images are view dependent in theory. However, due to the relatively high mean curvature in these regions, we can approximately locate their locations in an image. The reason we adopt these features is that they usually appear as bounding contours in an image, and bounding contours can usually be extracted much more reliably, especially in a static camera setting when a background model is available. These features are proven to be crucial in registering and modeling vehicles. They provide a new level of robustness than using the surface markings alone.

With reference back to FIG. 1, it is noted that FIG. 1(c) shows the two types of features drawn together with their mirror reflected parts. Notice that corresponding edge segments between a) and c) have the same shading (i.e., the same color in a color image). Same for b) and c).

1.2 Vehicle Taxonomy

We classify the consumer vehicle types into two classes. The first class of vehicles includes sedans, coupes, and pickup trucks. This class of vehicles has distinct extrusive cargo regions (a trunk or a cargo cabinet) at the rear side of the vehicle. The second class of vehicles includes hatchbacks, station wagons, vans, and sport utility vehicles (SUVs). This class of vehicles does not have separate, visible cargo regions. In terms of our edge segment model, contour feature segment 8 (horizontal side of a trunk) shrinks to a single point, and contour feature segment 7 (rear window side) and 9 (vertical side of a trunk) are aligned.

1.3 A Coupled Vehicle ASM

Figure 2:
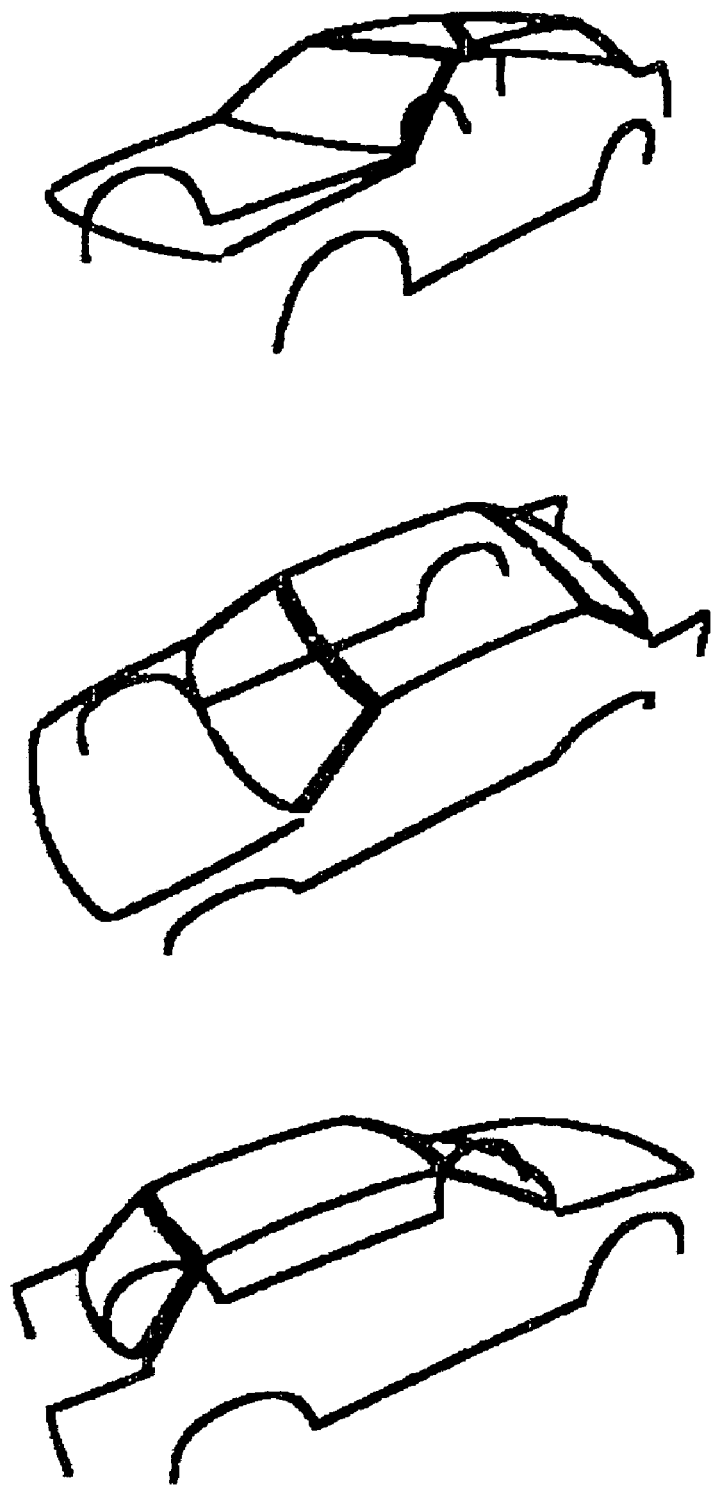
FIG. 2 illustrates three views of a mean shape for a vehicle ASM according to an exemplary embodiment of the present invention.

The twelve 3D edge segments (3 for surface marking and 9 for contours) are sampled such that each segment has a fixed number of points. We put the coordinates (X, Y, Z) of all the sampled points in all segments into a long vector and form our observed shape vector x. From our data, we extract shape vectors for 19 sedans, 8 coupes, 12 hatch-backs, 4 wagons, 4 vans, 6 SUVs and 5 trucks. Putting all 58 shape vectors together, we apply principle component analysis (PCA) as described in the Background section. We observe that the vehicle models lie in a low dimensional space. One mean shape vector plus a small set of (we choose ten) basis vectors can model the vehicle shape variations quite well. FIG. 2 shows the mean shape we extracted from the 58 training samples. Due to the larger percentage of sedans and coupes we adopted in building the ASM, the mean shape looks like a nice passenger car. The contours and surface markings all look quite smooth, due to the averaging effect over all the vehicle models. By varying the ten control parameters, we are able to model any vehicle type. See FIG. 3 for morphing between different vehicle types. Notice that this figure only demonstrates an extremely small portion of the possible vehicle shapes that can be modeled by our coupled ASM. Any vehicle type is capable of being morphed to any other vehicle type.

Figure 3:
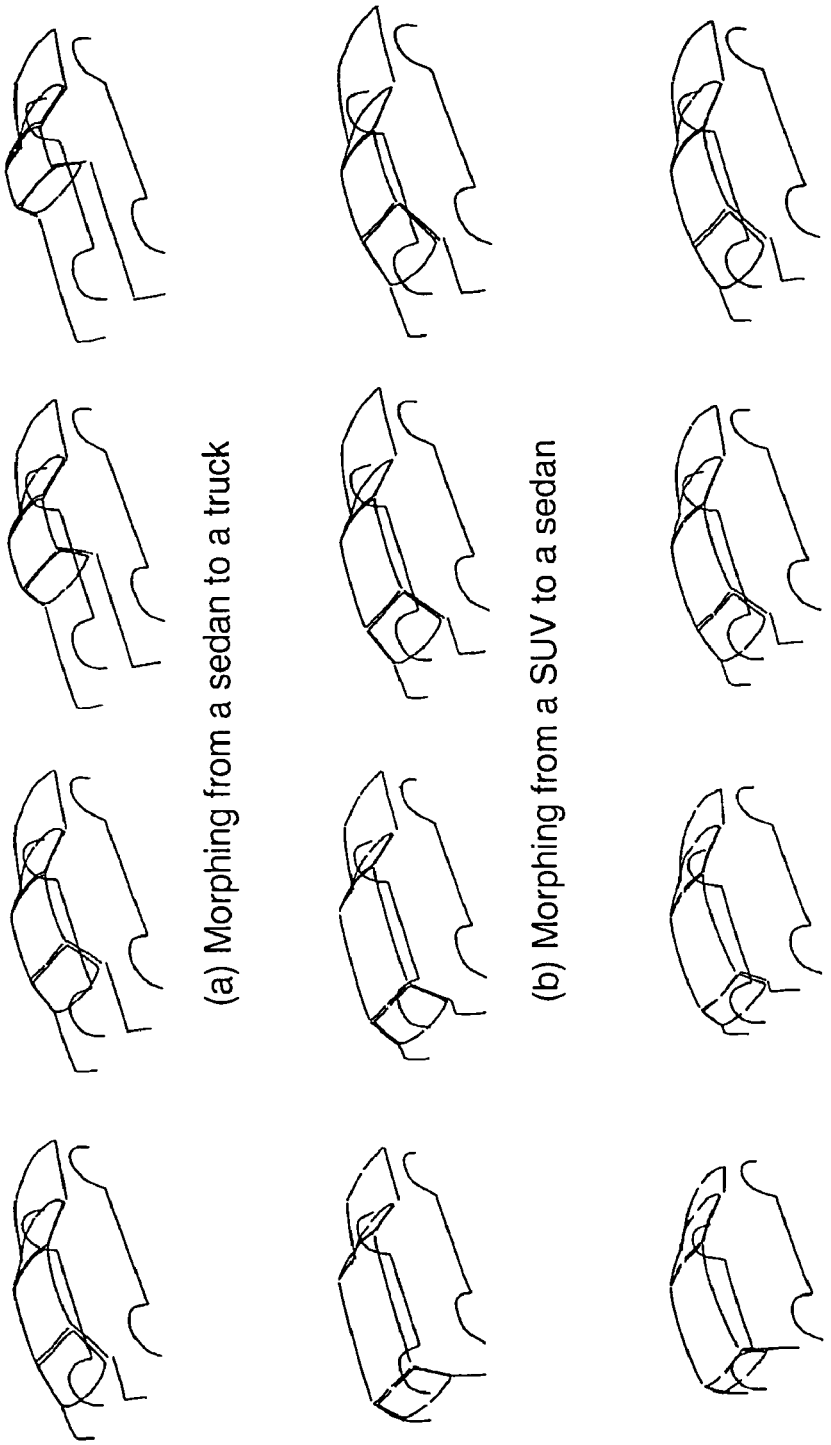
FIG. 3 illustrates morphing among different vehicle types according to an exemplary embodiment of the present invention.

In each row of FIG. 3 we show morphing from one vehicle type to another. The parameters λ are linearly interpolated between two vehicle types.

One can build separate ASMs for the surface markings and contours, each of which should have smaller variances than putting them into a single ASM. However, there is an important reason why we build a coupled ASM encompassing both. That is, we want to exploit the statistical correlation between the two types. For example, the contour segment 3 (front windshield side) and 4 (front windshield top) are tightly coupled with the surface marking type 1 (front windshield). From the observed surface markings we can infer the possibly invisible contour features. On the other hand, and more importantly, the easily extractable occluding contours can help locate the surface markings more reliably. Heuristically, it can be shown that combining both contour and interior features results in better recognition and localization of an object.

1.4 A Hierarchical ASM for Vehicle Class

ASMs can be defined to different levels of details. At the top level, we build a general ASM for all vehicle classes as discussed in previous sections. At a second level, we can build separate ASMs for the two subclasses we discussed in section 1.2. In the second subclass, we can abandon the contour segment 8 altogether. Next, ASMs can be built for each type of vehicle. At the finest level, more features can be added for more accurate vehicle models. Such features include the side windows, head/tail lights, and other vehicle model specific features. See FIG. 4 for such a hierarchy. The hierarchical ASM model can be used to register and model cars with increasing accuracy.

Figure 4:
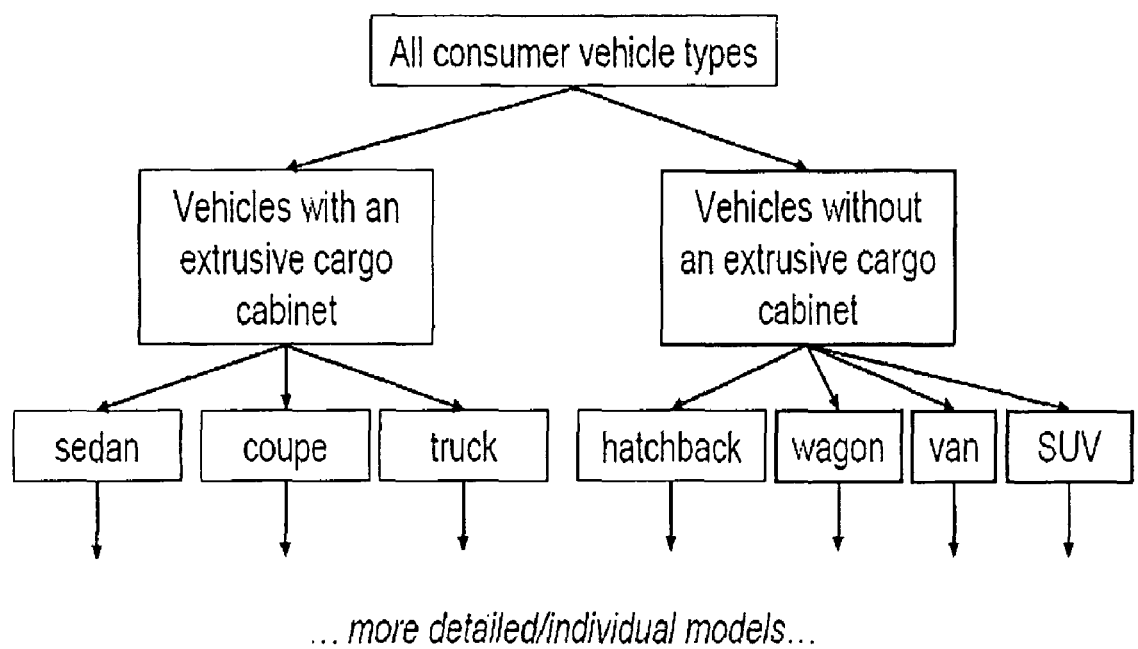
FIG. 4 illustrates a hierarchy of a vehicle ASM according to an exemplary embodiment of the present invention.

Referring to FIG. 4, notice that at each new level, more details are added to an ASM, including both surface marking and contour features. At the finest level, accurate individual models are listed.

1.5 Tools to Assist Building the Coupled ASM

Figure 5:
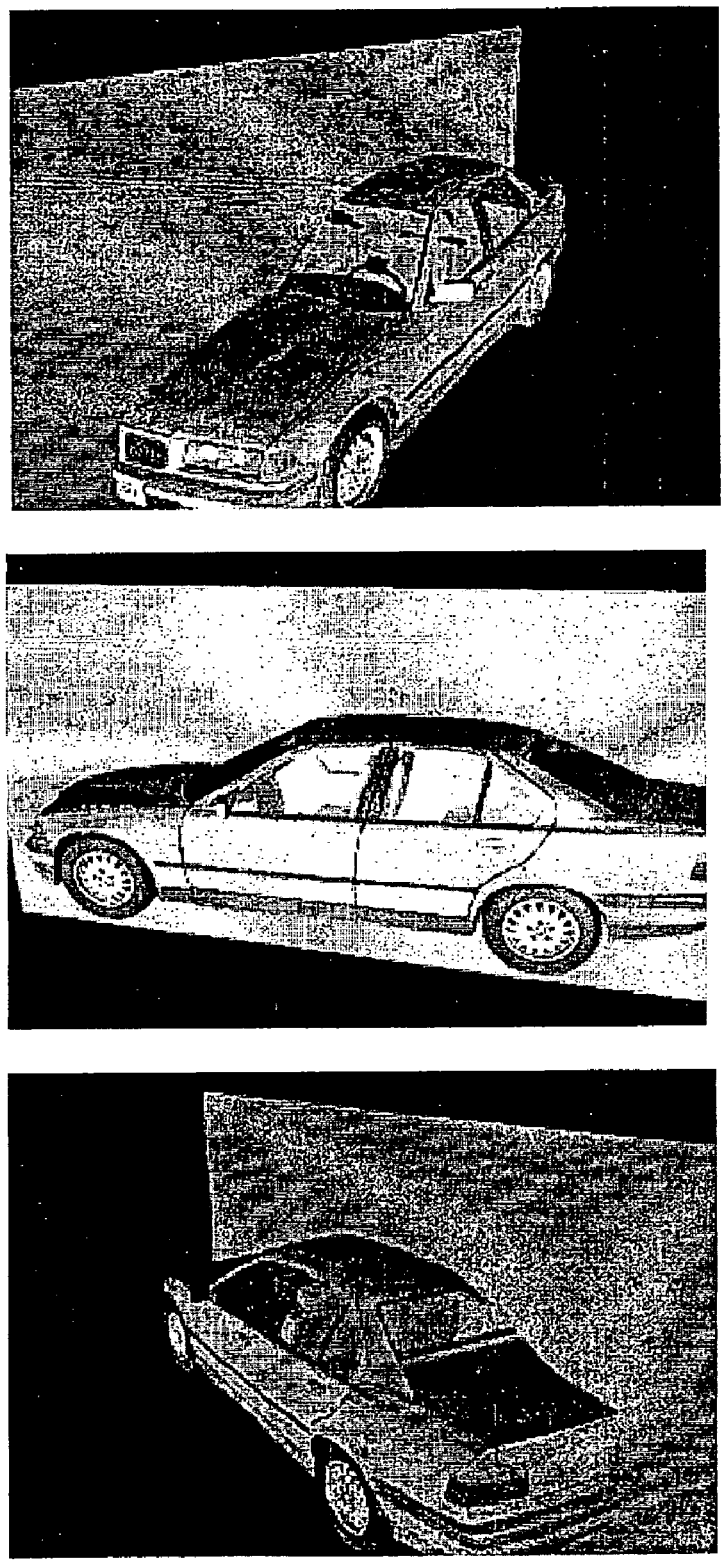
FIG. 5 illustrates three views from which textured point cloud models are extracted according to an exemplary embodiment of the present invention.

In this subsection we discuss the procedures and tools for extracting shape vectors from 3D models. Our inputs are 3D triangular models and simple texture/material types for each vehicle. The vehicles vary in a large range in the level of details, from several thousand triangles to hundreds of thousands of triangles. To work in a consistent framework, we build our first tool that converts a 3D mesh model to a textured point cloud model from three different views. See FIG. 5 for three such views. Notice that in this model we can have color (red, green, and blue) as well as a 3D position for each pixel. By selecting a pixel we know all the information we need for that pixel. Also notice that we have a plane that divides a vehicle into two symmetric segments. Due to symmetry, we only need to extract 3D models for one side.

The second tool for extracting 3D edge models is an interactive tool that asks a user to select from a reference image (FIG. 5), pixels that correspond to desired feature segments. For each hand labeled segment, we also ask the user to define a fixed number of landmark pixels. The landmark pixels are used to establish correspondences among different car models. After each edge segment has been selected by a user in a 2D image, we project it to 3D to form a coarse 3D edge model. The coarse 3D edge model is further linearly subsampled such that there are a fixed number of 3D points between any two consecutive landmark points. This procedure is repeated for each surface marking and contour segment in our model.

2. Registering and Modeling Using Coupled ASM

We first study the perspective projection of a point into a 2D image. The mean shape corresponding to a point is defined as $m^{(i)}=(m_x^{(i)}, m_y^{(i)}, m_z^{(i)})^T$, where $m_x^{(i)}$ is x coordinate of the $i^{th}$ point in the mean shape. We stack the shape variability vectors corresponding to this point into a matrix $$B^{(i)} = \begin{pmatrix} B_x^{(i)} \\ B_y^{(i)} \\ B_z^{(i)} \end{pmatrix} \quad (7)$$

where $B_x^{(i)}$ is a 1×M row vector by putting together all M variability values corresponding to x coordinate of the $i^{th}$ point. As a result, the 3D point can be written as $$x^{(i)} = m^{(i)} + B^{(i)} \cdot \lambda \quad (8)$$

Given the external calibration R (rotation matrix) and T (translation vector) of a perspective camera, and assume that the camera is internally calibrated, we project the 3D point into the normalized sensor plane [R. Y. Tsai. A versatile camera calibration technique for high-accuracy 3D machine vision metrology using off-the-shelf TV cameras and lenses. IEEE Journal of Robotics and Automation, RA-3(4):323-344, August 1987, the disclosure of which is incorporated by reference herein in its entirety] using $$\tilde{x}^{(i)} \cong R \cdot x^{(i)} + T \quad (9)$$

$$= Rm^{(i)} + RB^{(i)}\lambda + T \quad (10)$$

where $\cong$ means equality up to a scale.

Denote the 2D observed feature points as $$\tilde{x}^{(i)} = \begin{pmatrix} k \cdot u^{(i)} \\ k \cdot v^{(i)} \\ k \end{pmatrix} \quad (11)$$

where k is an unknown scaling factor.

For each point $x^{(i)}$ we can formulate two nonlinear equalities in terms of the shape parameters $\lambda$ and pose parameters R and T. This is done by scaling the right side of (3) such that the last component is one, $$\begin{cases} u^{(i)} = \dfrac{r_1^T(m^{(i)} + B^{(i)}\lambda) + T_1}{r_3^T(m^{(i)} + B^{(i)}\lambda) + T_3} \\ v^{(i)} = \dfrac{r_2^T(m^{(i)} + B^{(i)}\lambda) + T_2}{r_3^T(m^{(i)} + B^{(i)}\lambda) + T_3} \end{cases} \quad (12)$$

where $r_n^T$ is the $n^{th}$ row of the rotation matrix R and $T_n$ is the $n^{th}$ component of the translation vector T.

Given a set of 2D-3D correspondences $(u^{(i)}, v^{(i)})^T$ and $m^{(i)}$, $B^{(i)}$ i=1, 2, . . . , N, the goal is to simultaneously find the registration (R and T) and the shape ($\lambda$) of the vehicle whose projection is observed in an image.

2.1 General Case Solutions

In general, the solution (R, T, $\lambda$) to the system of equations in the form of (12) is difficult. This is due to two reasons. First, the 2D-3D correspondences are difficult to establish in general unknown viewing directions. Second, the equations are nonlinear in unknown shape and pose parameters. Solving the system of equations even when we know the correspondences is nontrivial. We will follow from our previous approach with a two step approach. As a first step, we use an object detector/classifier to find the object instance and determine its rough pose. This problem has been previously studied by us in [A. Boffy, Y. Tsin, and Y. Genc. Real-time feature matching using adaptive and spatially distributed classification trees. In British Machine Vision Conference, 2006, the disclosure of which is incorporated by reference herein in its entirety] in the case of a single object instance, e.g., for a specific car, and in the case of an object class from a fixed viewing angle [U.S. patent application entitled "Method for Detecting Objects Using Flexible Edge Arrangements". Ser. No. 12/052,864, and filed Mar. 21, 2008, the disclosure of which is incorporated by reference herein in its entirety]. However, extending these works to a whole object class under any viewing direction is still an open and difficult problem.

After the initialization step by an object detector/classifier, the accurate pose and shape of a vehicle can be refined using a local gradient descent type of optimization. Namely, we iterate between finding putative correspondences and updating the parameters (R, T, $\lambda$). For edge features, the putative correspondences are those high intensity gradient pixels along the normal direction. How to properly weight their influence and use them for registration is discussed in [Y. Tsin, Y. Genc, and V. Ramesh. A very fast and jitter-free tracker by model-guided detection and matching, unpublished, the disclosure of which is incorporated by reference herein in its entirety] and [U.S. Patent Application Publication No. 20060188131, filed Feb. 22, 2006, the disclosure of which is incorporated by reference herein in its entirety]. To update the pose and shape of a vehicle from an initial position, we locally linearize the equalities (12) and solve a weighted least squares problem where the weights come from the kernel correlation framework. For details, please refer to [Y. Tsin, Y. Genc, and V. Ramesh. A very fast and jitter-free tracker by model-guided detection and matching].

2.2 A Special Case

We discuss an important special case in this section. In this special case, we can find the global optimum by simple weighted least squares, given a set of 2D-3D correspondences. This special case is when the rotation matrix R is known. For example, in the video surveillance/security case, static cameras observe scenes where the vehicles are constrained to travel along the roads. Using an offline calibration step, we can learn the rotation matrix R for each position on the road. In an even more special case, R is constant if the vehicles are constrained to travel along a linear track.

Once R is known, the equalities (12) are linear in unknowns T and $\lambda$. To see this, let us denote $$\begin{pmatrix} \tilde{m}_x^{(i)} \\ \tilde{m}_y^{(i)} \\ \tilde{m}_z^{(i)} \end{pmatrix} = Rm^{(i)} \quad (13)$$

and $$\begin{pmatrix} \tilde{B}_x^{(i)} \\ \tilde{B}_y^{(i)} \\ \tilde{B}_z^{(i)} \end{pmatrix} = RB^{(i)} \quad (14)$$

It is easy to show that $$\begin{cases} \tilde{m}_x^{(i)} - u^{(i)} \cdot \tilde{m}_z^{(i)} = (u^{(i)}\tilde{B}_z^{(i)} - \tilde{B}_x^{(i)})\lambda + \begin{pmatrix} -1 \\ 0 \\ u^{(i)} \end{pmatrix}^T T \\ \tilde{m}_y^{(i)} - v^{(i)} \cdot \tilde{m}_z^{(i)} = (v^{(i)}\tilde{B}_z^{(i)} - \tilde{B}_y^{(i)})\lambda + \begin{pmatrix} -1 \\ 0 \\ v^{(i)} \end{pmatrix}^T T \end{cases} \quad (15)$$

Notice that the R is known in a pan/tilt/zoom (PTZ) camera as well if the PTZ numbers can be read, which is almost all the cases. As a result, this special case can find a large area of applications in surveillance/security applications.

3. A Case Study and Results

We use a Sony camera (SNC-RZ30N) mounted on a building top to acquire videos. Compressed video is streamed to a workstation using network connections. The compression effect is quite visible and the video quality is very low. Due to network bandwidth, the video can be sent either at around 30 frames per second (fps) at the quarter-VGA resolution (320×240) or full-VGA resolution (640×480) at 5-10 fps. In addition to the low video quality, we have to make a compromise between the temporal resolution (frame rate) or the spatial resolution (image size). Despite all these adversary conditions, we are still able to model and register various vehicles present in the image. Better image qualities make the problem even easier.

The camera is calibrated both internally and externally. A subset of contour and surface marking segments corresponding to this viewing angle is predefined.

Figure 6:
FIG. 6 illustrates a process of building a background likelihood model according to an exemplary embodiment of the present invention.
Figure 6:
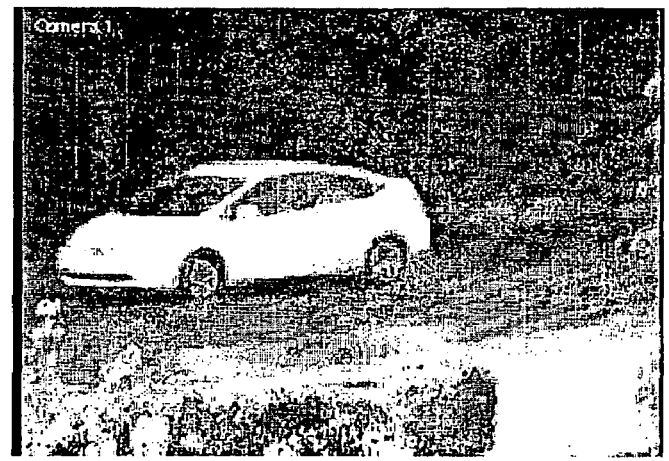
Figure 6:
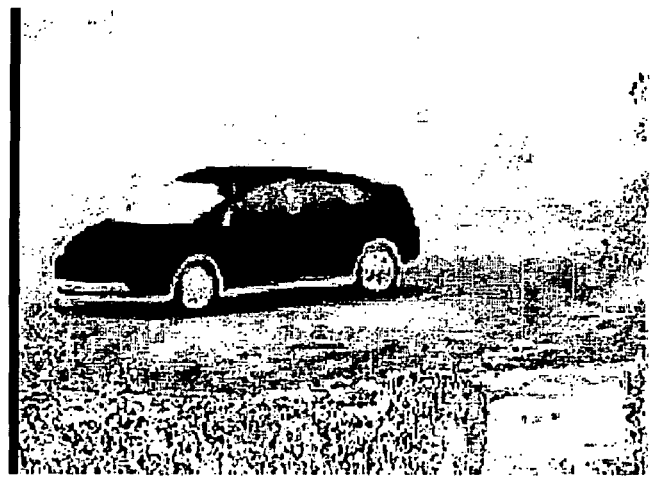

The camera remains static while we capture video. We maintain a background model of the scene (see FIG. 6(a)). When a vehicle enters the scene, the observed image (FIG. 6(b)) is subtracted from the background image. A background likelihood map is built using $$p_d(u) \propto \exp\left(-\frac{d^2(u)}{\sigma^2(u)}\right) \quad (16)$$

where $d(u)$ is the intensity difference at a pixel u and $\sigma(u)$ is the noise standard deviation at the pixel. In this embodiment, we set $\sigma$ to a constant for all pixels. Such a background likelihood model is shown in FIG. 6(c). The blocky effect on the background is due to image compression. The occluding contours correspond to the transition between extremely likely background pixels (white) to extremely unlikely pixels (black). When the foreground object is distinctive, such boundary extraction is usually very reliable. It is this background likelihood map that provides invaluable robustness to our registration and modeling algorithm.

The background subtraction results also provide us with a bounding box for the potential car regions. The mean shape is translated such that its center is projected to the center of the bounding box, thus a known initialization for the translation vector T. We initialize the shape vector to a zero vector $\lambda=0$.

Starting from this initialization, putative correspondences for each point are found in the image. This is achieved by finding gradient extrema along the directions normal to the edge. Details of this process can be found in [Y. Tsin, Y. Genc, and V. Ramesh. A very fast and jitter-free tracker by model-guided detection and matching]. Note that for the surface markings, we find gradient extrema in the current video frame. For the contour segments, we use the background likelihood map to find correspondences.

Figure 7:
FIG. 7 illustrates a few iterations in correspondence finding according to an exemplary embodiment of the present invention.

Each of the candidates is weighted according to their distance to the projection of the point under current parameters in a kernel correlation fashion [Y. Tsin, Y. Genc, and V. Ramesh. A very fast and jitter-free tracker by model-guided detection and matching]. In addition, we add a time varying weight for the contour segments. At the beginning, we give the contour segments more weight such that the more reliably detected occluding contours can guide the registration and modeling to the desired solution. While we iterate between correspondence finding and parameter estimation, we gradually decrease the weight for the contour segments such that the more accurate surface markings take the major role. FIG. 7 shows a few iterations in the correspondence finding.

Note that the linear space defined by the mean shape and the variability vectors is a superset for the possible vehicle models. The shape vectors corresponding to consumer cars occupy only a tiny portion around the origin in the whole linear space. Thus, it is very important to constrain the shape parameters using their prior distribution (6). If the shape parameters are not constrained, the parameters can quickly wander outside of the high-dimensional ellipsoid defined by (6) and become non-vehicle shapes.

Figure 8:
FIG. 8 illustrates registration and modeling results according to an exemplary embodiment of the present invention.

FIG. 8 shows several examples of simultaneous registration and modeling. Each column shows the process of modeling and registering for a specific vehicle. The last row shows the final car model viewed from a different angle. In all of the examples we do not have the exact 3D models from our training examples. For instance, the Toyota Prius (second column) is a quite new car and it has a quite unusual shape. But our algorithm is able to register and model this unseen/unusual car quite well. We have the same case for the fourth column, in the case of a Chrysler PT-cruiser.

Key aspects of the embodiments just described can be summarized as follows:
1. Using ASM based on 3D edge features to represent the class of consumer vehicles.
2. Coupling of surface markings and contours in a single ASM for both accuracy and robustness.
3. The technique of representing the general class of vehicle model, e.g., abstract vehicle models involving a certain number of surface markings and contours. See section 1.1 and FIG. 1, as well as the technique of classifying the types of vehicles for visual modeling purposes.
4. The hierarchical ASM for the vehicle class, see section 1.4.
5. Solutions to the simultaneous registration and modeling problem in the general case (section 2.1) and in the special case (section 2.2).
6. Using background likelihood map (16) for reliably detecting object boundary.
7. The technique of establishing correspondences (FIG. 7 and [Y. Tsin, Y. Genc, and V. Ramesh. A very fast and jitter-free tracker by model-guided detection and matching, unpublished]).
8. The iterative updating of shape and registration in the vehicle modeling case.

Now that we have shown that ASMs can be used for the class of consumer vehicles, where a small number of principle shape components (8-10) plus a mean vehicle shape can model a large class of vehicles, in the following sections we will describe the tools and methods for extracting ASM models for the vehicle class, as well as a triangulation of portions of the vertices for full 3D vehicle models.

As discussed above, an ASM is a concise shape representation of an object class. It contains a mean shape represented by a vector, plus a set of shape variability vectors of the same length. Building an ASM proceeds as follows:
1. Collect a set of object instances in the class.
2. Find a set of corresponding points on the object instances. For example, point n in all instances represents the top left corner of the front windshield, while point m in all instances represents the center of the front driver-side wheel.
3. Use PCA to extract the mean shape and the variability vectors. At the same time, we get a statistical model on the shape, represented by the projected coefficient distributions.
4. Optionally, a triangular mesh is defined on the set of points such that the object class is represented by surfaces, instead of just points.

The first step, e.g., data collection, is easy since many 3D models for cars are available online. Highly accurate models can also be purchased as individual vehicle models or as car model packages. The third step is also a standard procedure.

The following discussion focuses on the second step, namely, how to interactively find the corresponding points on the object class of consumer vehicles through user interaction. Notice that the variability of the class of vehicles is so large that automatic methods such as procrustes alignment does not guarantee performance, which necessitates manual inputs. It is also a challenge to define a triangular mesh for a diverse object class such as vehicles. It is necessary to keep all surface normals of all the triangles approximately intact, while allowing morphing a sedan to a truck, or a hatchback to a van. We will spend a section discussing our triangulation scheme as well.

We believe that an ASM for the vehicle class will have important applications in video surveillance/security, automobile driving safety, entertainment (motor racing), etc.

4. Building a Full 3D Mesh ASM

Figure 9:
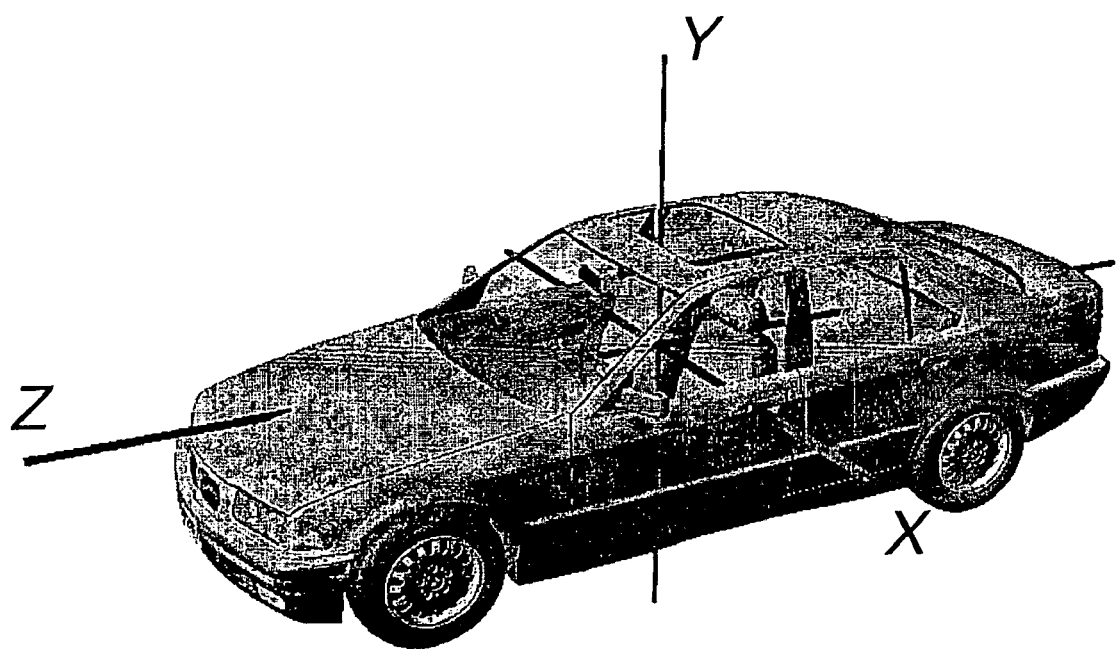
FIG. 9 illustrates an axis aligned car model according to an exemplary embodiment of the present invention.

We assume that all the input 3D models have been aligned. Each vehicle is heading toward the Z direction of a world coordinate system X-Y-Z. The vehicles are parallel to the X-Z plane, and they are symmetric with respect to the Y-Z plane. An example of an aligned vehicle is given in FIG. 9.

4.1 Converting All Models to VRML

We collected our 3D car models from the internet where the models are mainly for graphics purposes. They come with different file formats, such as the 3D Studio (0.3ds) file format and the LightWave object (.lwo) file format. To treat all 3D models uniformly, we convert them to the virtual reality markup language (VRML) file format (.wrl). We use Light-Wave 8.0 for this purpose.

4.2 Rendered Textured Point Cloud

Figure 10:
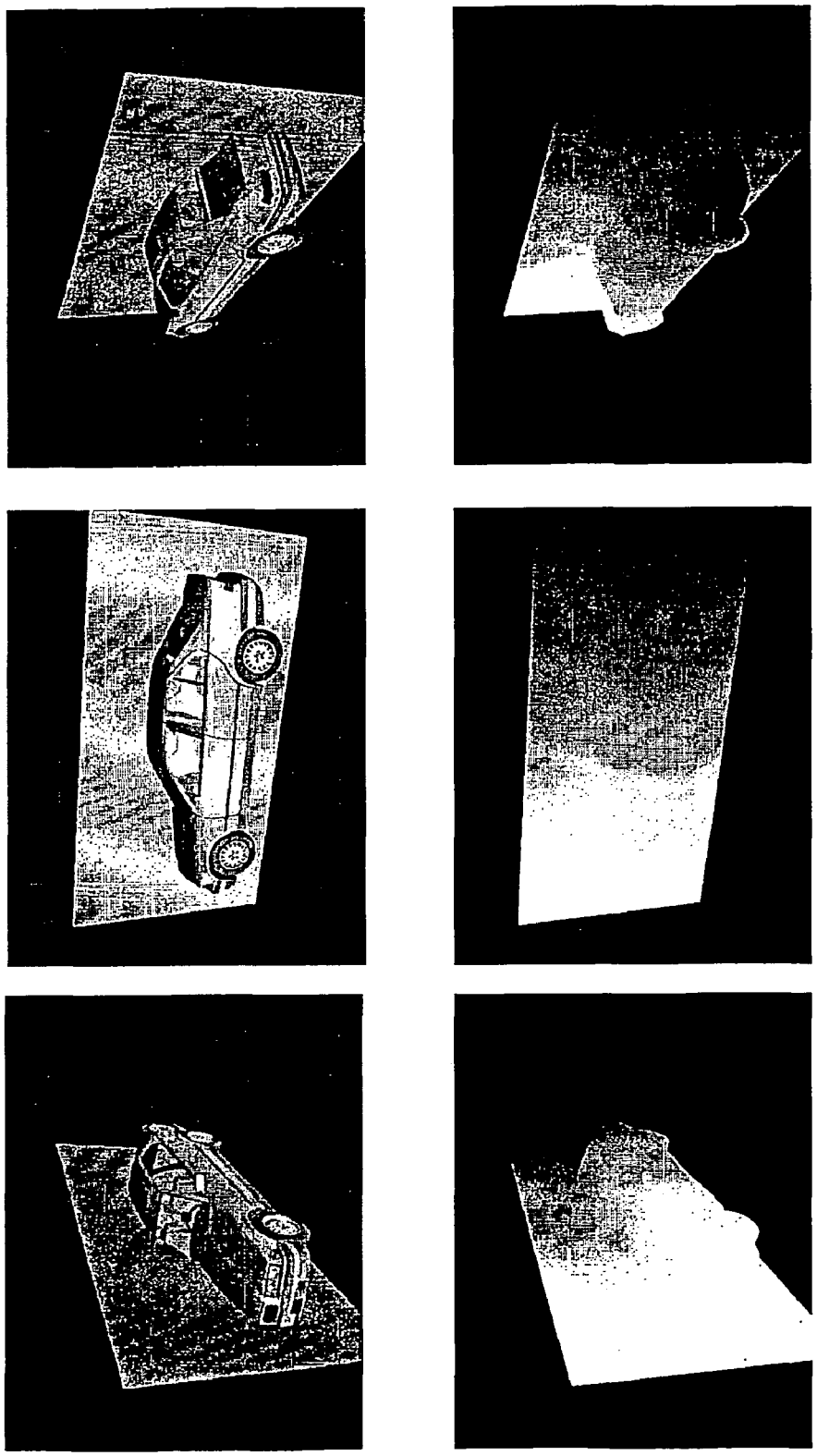
FIG. 10 illustrates three rendered views for a car model according to an exemplary embodiment of the present invention.

We then use OpenVRML to render all the VRML files. We control the virtual camera to look at the vehicles from three fixed viewpoints. When the images are rendered, we save two sets of data, 1) the rendered color images, and 2) the 3D point positions corresponding to all the pixels in the images. An example of such outputs is shown in FIG. 10. Note that we effectively generated a textured 3D point cloud, i.e., a set of 3D points each of which has an associated RGB color.

In FIG. 10, the plane in center divides the car into two halves. Due to symmetry we only need to work on half of the model and geometry of the other half can be obtained via mirror reflection. First row: the rendered images. Second row: Z values of the corresponding pixels. Although not shown here, the X and Y axes values for all pixels are also known.

4.3 Interactive Labeling of Landmark Edge Segments

Figure 11:
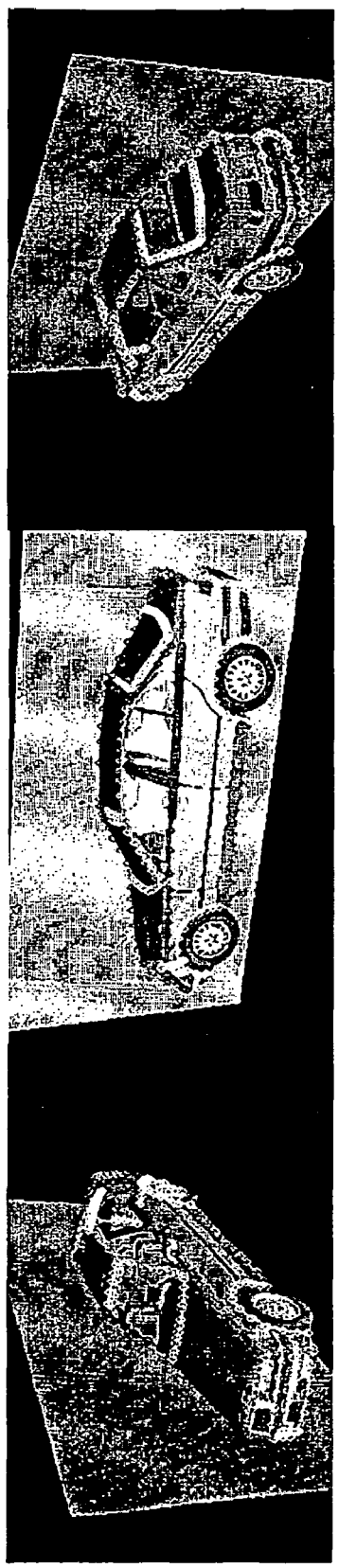
FIG. 11 illustrates manually picked points projected to three rendered views according to an exemplary embodiment of the present invention.

A person is asked to manually label some salient landmark edges for each vehicle in all three rendered 2D images. For instance, in the first view, the front windshield, side of the front hood, and window frames are drawn by the person. All labeled edges are shown in FIG. 11 from the three rendered views. Note that the labeled edges are manually picked points (diamonds) which are projected onto the three rendered views. Due to symmetry of the vehicles, we only need to label half of each vehicle.

Also notice that a sparse set of points are drawn on each edge. Denser point sets will be sampled accordingly as described in the next section. The same number of landmark edges are labeled for every vehicle type and there is a one-to-one correspondence between landmark edge segments of any two different models. The order of the points in each landmark edge also corresponds, i.e., the first point in an edge always represents the same physically meaningful point across all models, and so does the last point. We do not require that points in between correspond.

Figure 12:
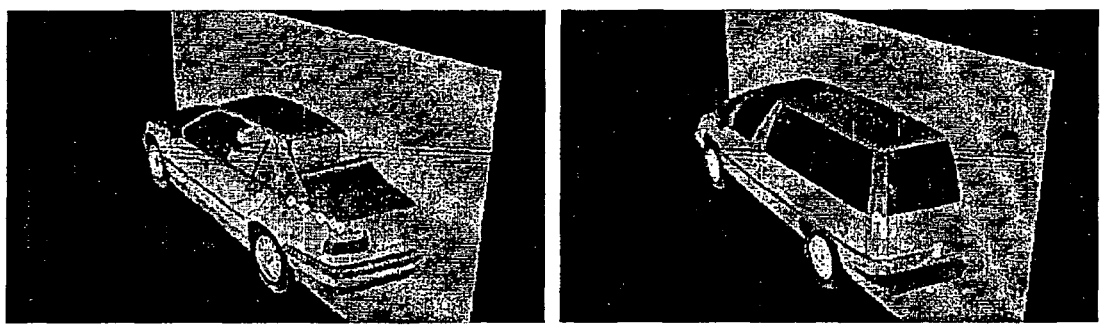
FIG. 12 illustrates a horizontal edge corresponding to the trunk side collapsing into a single point for a vehicle that does not have a rear cargo trunk according to an exemplary embodiment of the present invention.

Some vehicle types, including vans, station wagons and hatchbacks, do not have a rear cargo trunk. In this case, the horizontal edge corresponding to the trunk side collapses to a single point. This is shown in FIG. 12.

Figure 13:
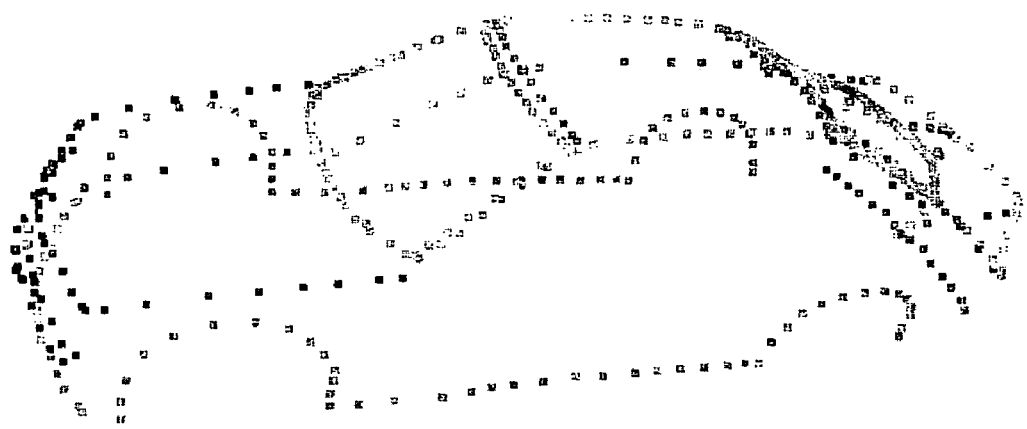
FIG. 13 illustrates two views of a sparse three-dimensional (3D) model obtained by projecting all hand picked points to 3D according to an exemplary embodiment of the present invention.
Figure 13:
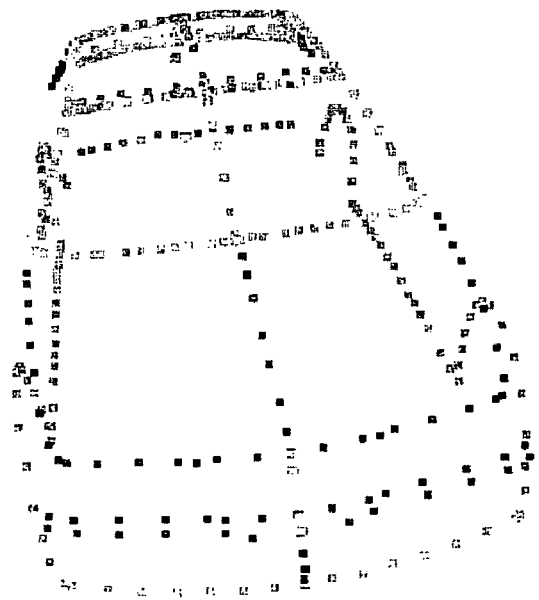

Since we know the 3D point corresponding to each point in an image, we effectively extracted a sparse 3D edge model for each vehicle. See FIG. 13.

4.4 Uniform Sampling of a Reference Model

After the previous step, we have a set of landmark edges with a very sparse set of hand picked points on each of them. The goal of this step is to interpolate between any two user input points so that we have a denser point set.

To do this, we treat each landmark edge as a line-segment model, i.e., we have one straight line segment between any two consecutive user picked points. We travel along the line-segment model from the first point to the last point, and take one point whenever we travel a distance of d in 3D, where d is a predefined small distance, and all distances are measured in 3D. We call this process of taking uniformly spaced points along the 3D line-segment model the sampling process.

The sampling process is conducted only on a single vehicle, the reference vehicle. The user labeled set of landmark edges, the sample distance d and the reference model define the number of points in each line segment.

4.5 Sample Other Landmark Edges According to the Reference

Once the landmark edges in the reference model are sampled, the number of points in each edge segment is defined. We then sample all other models to ensure that there are an equal number of equally spaced points in all corresponding landmark edges. To achieve this, we first compute the total length of the $i^{th}$ landmark edge (a 3D line-segment model defined by the hand picked points) and denote the length as $l_i$. The corresponding landmark edge in the reference model has $n_i$ sampled points. Thus, we know that the sampling distance on this model is $$d_i = \frac{l_i}{(n_i - 1)} \qquad (17)$$

Once we have computed $d_i$, we proceed to sample the current landmark edge the sample way: traveling along the 3D edge and taking a sample point whenever we travel a distance of $d_i$.

Figure 14:
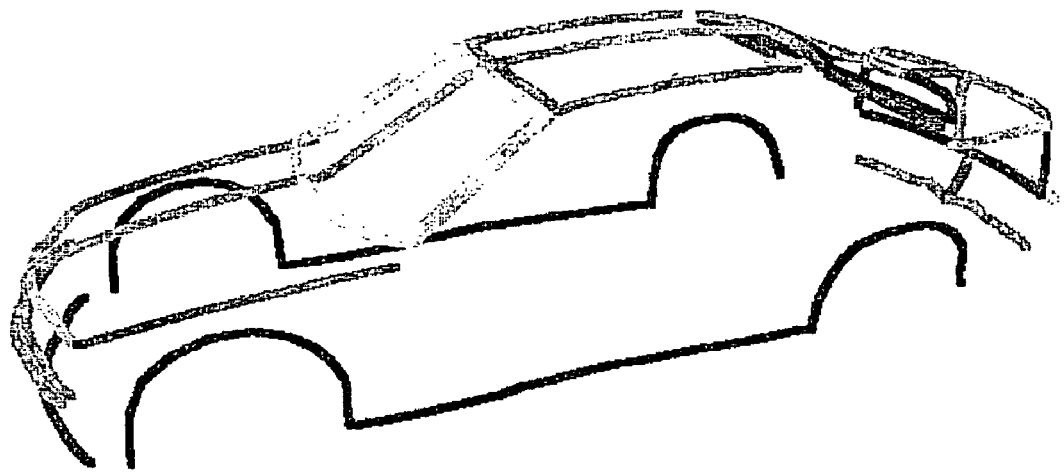
FIG. 14 illustrates two views of a denser 3D model obtained by uniform sampling along edges according to an exemplary embodiment of the present invention.
Figure 14:
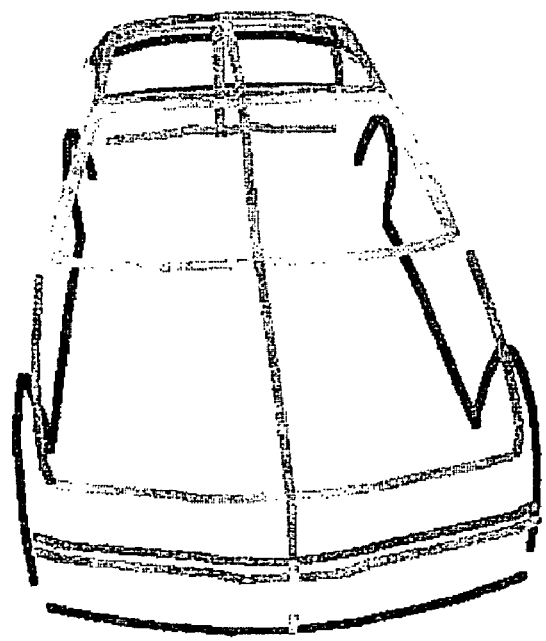

After the sampling process, we build a denser set of corresponding landmark edges. See FIG. 14.

4.6 Add Additional Points for Triangulation

Some applications require a full 3D vehicle model, instead of just edge-based models. For example, if we need to compare two images of a car from two different viewing angles, we need to warp them into a common camera view. Such an operation requires 3D information for each point. To achieve this we need to define a triangular mesh model for the car.

Figure 15:
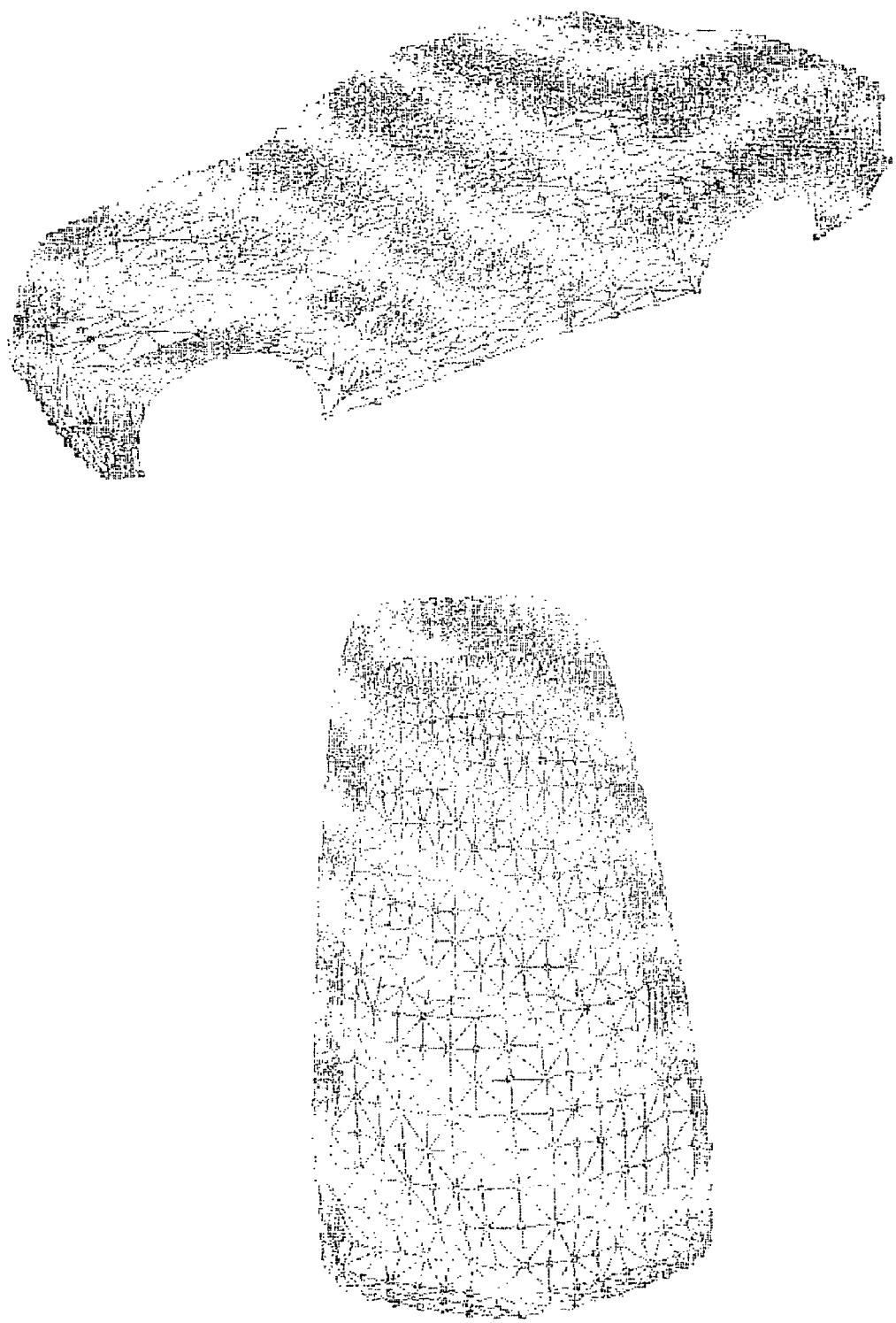
FIG. 15 illustrates two views of a mesh model obtained by sampling along user picked contours according to an exemplary embodiment of the present invention.

We do this by uniformly sampling points along edges between two user picked points. The resulting vertices are shown in FIG. 15.

4.7 Apply PCA

Figure 16:
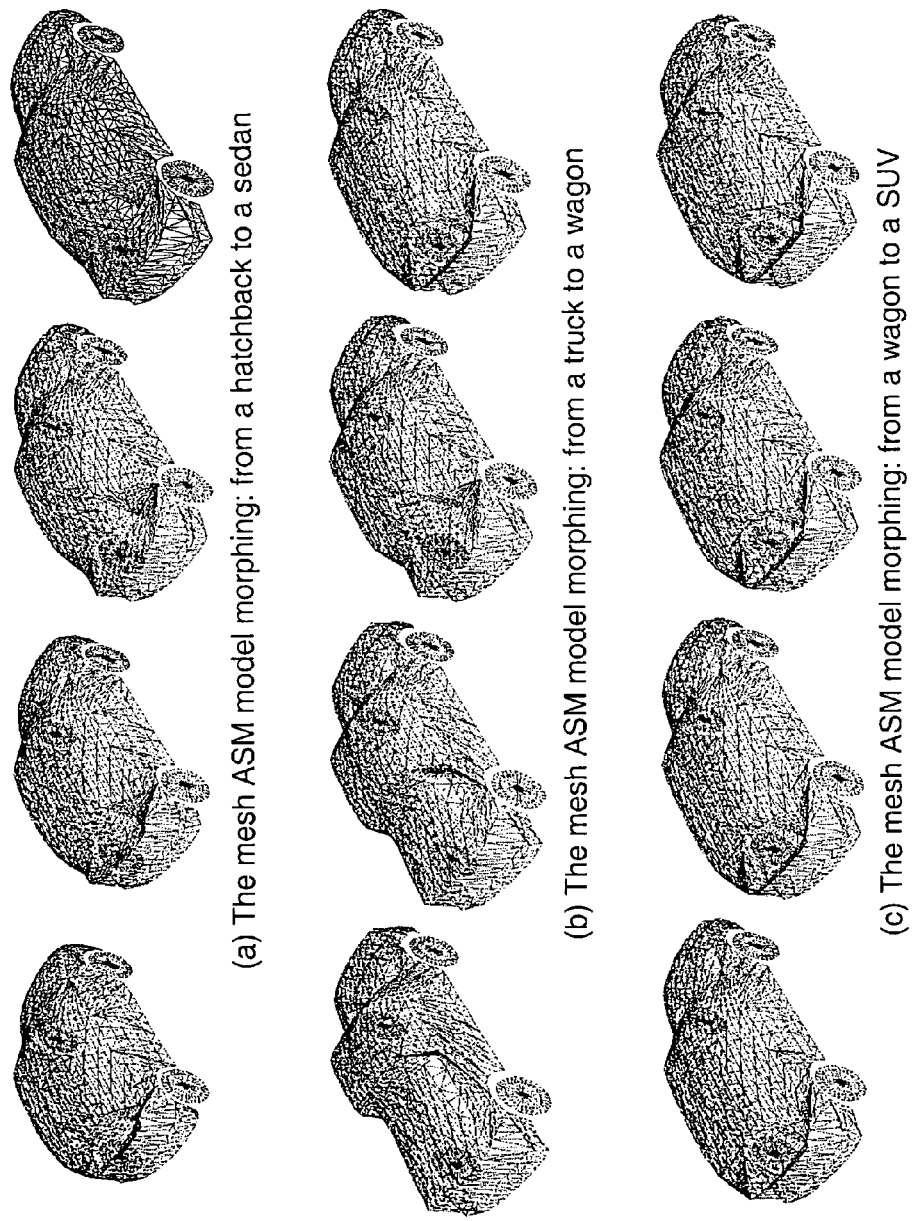
FIG. 16 illustrates morphing among vehicle types according to an exemplary embodiment of the present invention.

For each vehicle type, we stack all points, including the dense set of samples from landmark edges and the set of additional points for triangulation, into a long vector. For all 54 vehicle types we have, we extracted 54 such long vectors. We then apply PCA on all of them. We found that using only a mean shape and 8-10 principle shape vectors, we are able to model all the vehicles quite well. FIG. 16 demonstrates the synthesized vehicles by interpolating 10 parameters among different vehicle types.

Similar to FIG. 3, in each row of FIG. 16 we show morphing from one vehicle type to another.

4.8 Triangulation

The challenge of triangulation is that we are dealing with a class of objects that have significant shape variations. We need to define the triangular mesh such that the same triangulation applies in all instances, and there should be no folding under all instances. The triangular mesh is defined as shown in FIG. 17.

Figure 17:
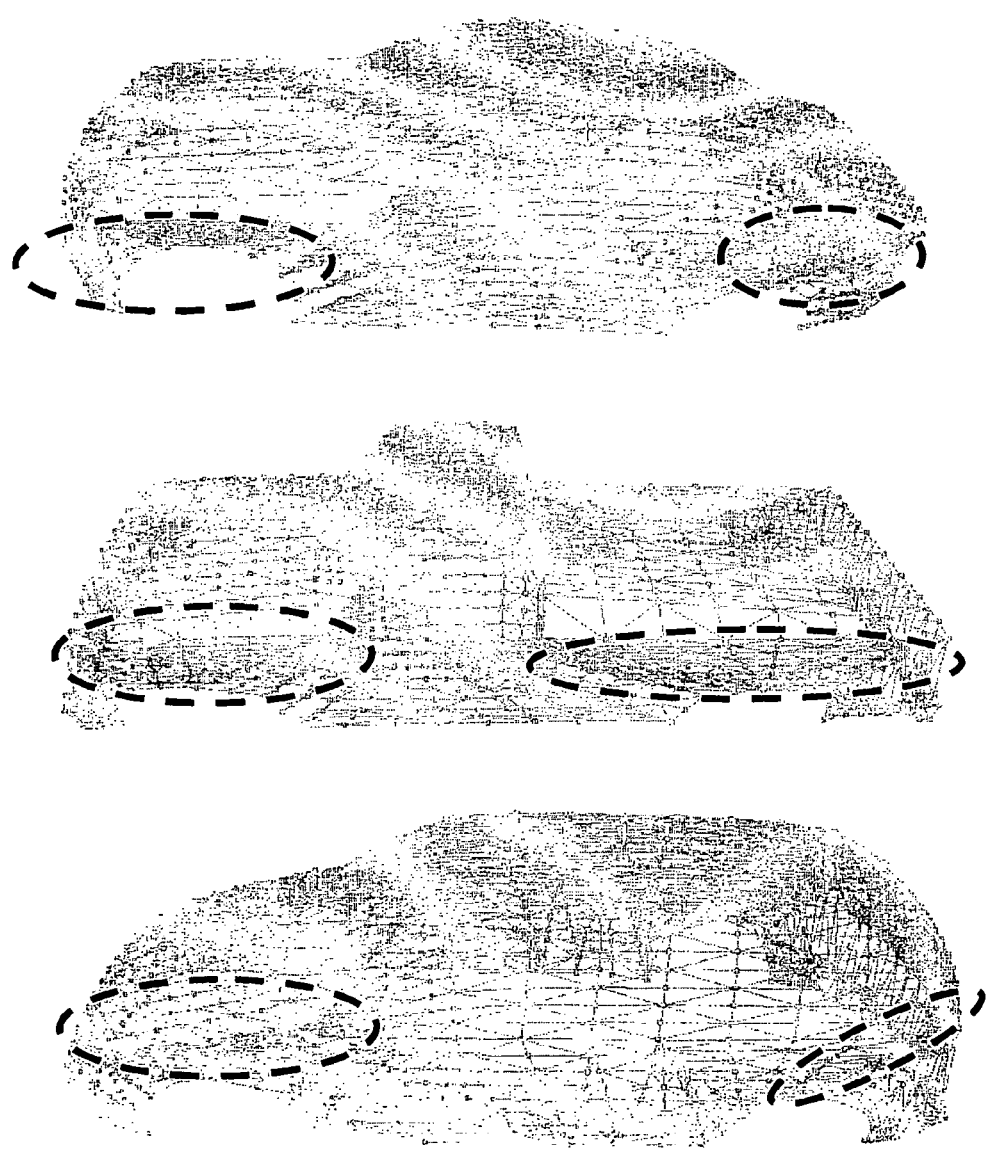
FIG. 17 illustrates the same set of triangulation being applied to different vehicle types that have different shapes according to an exemplary embodiment of the present invention.

Referring to FIG. 17, note that the same set of triangulation works for every vehicle type.

5. Application of the Full 3D ASM

Figure 18:
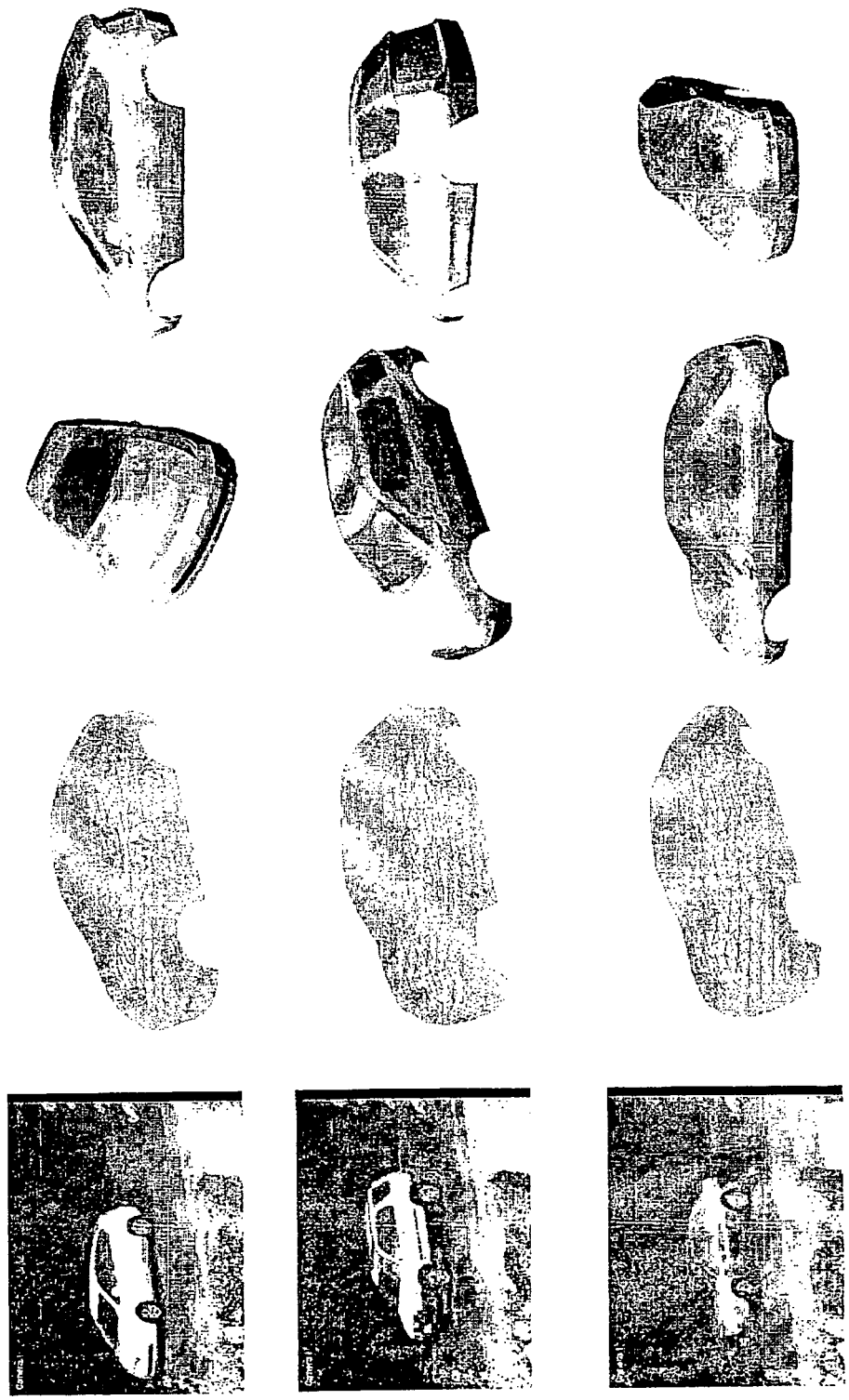
FIG. 18 illustrates estimating a full 3D model from a single calibrated image using a vehicle ASM according to an exemplary embodiment of the present invention.

There will be many applications of the extracted 3D full ASM model. As one example, we show that we are able to simultaneously estimate the position of the vehicle and the full 3D model of a vehicle appearing in an image. The technique is the same as that described earlier in this disclosure, using only the dense 3D edge points. However, because we put both the edge segments as well as the mesh points into the same ASM, the mesh points are also estimated. FIG. 18 demonstrates the power of the models: full 3D model from a single image.

Leftmost column: the input image. Second column: the estimated full 3D model shown as a triangular mesh. All other columns: extracted full 3D model viewed from other angles. Notice that while doing texture mapping, we did not use visibility reasoning. That is why we assigned "texture" for some of the invisible parts. We also use symmetry to map texture on the 3D models.

Key aspects of the embodiments just described can be summarized as follows:

1. The utility of ASM in the vehicle class.
2. The observation that a small set of principle shape components are sufficient for describing a large class of vehicles.
3. The tools and methods for extracting ASM from graphics models.
4. The technique of triangulating the ASM such that we can use a fixed triangulation for all models, while there is no folding occurring in any vehicle instance.

Several additional embodiments will now be presented that expand upon the previously discussed embodiments. These embodiments include: coupling surface markings (edge feature points) and triangular mesh vertices in a joint ASM; using rendered occluding contours and salient edges for full vehicle surface modeling from a single image; using rendered occluding contours and salient edges for geometric vehicle re-identification; using additional surface markings for re-identification; using strong feature descriptors for re-identification; using texture mapped 3D car models for appearance based re-identification; and color normalizing all scenes before comparing appearances.

The modeling step, discussed previously, and hereinafter in further detail, builds full 3D car models so that we can match cars from drastically different viewpoints, a capability no other existing approaches are able to achieve. At the same time, the car models are accurate and discriminative enough that geometry provides strong cues for re-identifying cars from any angle.

6. A Joint ASM

Surface markings that are important for modeling and re-identification, such as the edges corresponding to front and rear windshields, cannot be modeled by the smooth surface model. Thus, we put 3D points that correspond to salient edge features together with the vertices of the triangular mesh in a long feature vector in order to extract an ASM. For details of extracting an ASM from a set of feature vectors, please refer to section 1.3. By coupling the two together, we can infer invisible edge features from object shape (occluding contour) by exploiting their correlations in the ASM. At the same time, the visible edge features contribute to modeling a vehicle or re-identifying a vehicle more precisely.

Notice that we no longer need to keep the "quasi-contour" segments in our full 3D mesh ASM as mentioned earlier. The reason is that we now have a full 3D surface model and the true (instead of "quasi") contours can be inferred from the surface model.

7. Enrolling/Modeling Using Rendered Occluding Contours and Surface Markings Given a known pose of a vehicle and known camera internal calibrations, we can project the mean shape (a component of the ASM) into an image. We take into account two sets of feature points that can be used for modeling. First, we trace along the occluding contour of the projection and find the set of vertices that contribute to the contour. Second, we project all visible surface markings to the image. If the car shape is accurately described by the current model, the projections, both the occluding contour and the surface markings, should be exactly on the observed object contour and surface markings. Otherwise there would be a gap. The driving force for ASM update is the difference between the model projections and image observations. Our goal is to minimize these differences. For more rigorous mathematical descriptions of feature correspondences and model updates, see section 2.

Once the car model update is finished, we record the ASM model and enroll the car. An enrolled car can include many signatures. The most important parts are the car 3D shape described by a set of ASM coefficients; an image used for texture mapping the car model; all geometric and photometric parameters of the enrollment camera; car pose and a time stamp.

8. Geometric Re-Identification Using Rendered Occluding Contours and Surface Markings We take an alignment approach for re-identifying a vehicle using geometry. Given an approximate pose of a vehicle, the enrolled car model and camera internal calibration, we can project the car shape into an image. We take into account two sets of feature points that can be used for re-identification. First, we trace along the occluding contour of the projection and find the set of vertices that contribute to that contour. Second, we project all visible surface markings to the image. If the car shape is accurately described by the current model and the pose are correct, the projections, both the occluding contour and the surface markings, should be exactly on the observed object contour and surface markings. Otherwise there would be a gap. The driving force for car pose update is the difference between the model projections and image observations. Our goal is to minimize these differences. For more rigorous mathematical descriptions of feature correspondences and pose update problems, see section 2 and [Y. Tsin, Y. Genc, and V. Ramesh. A very fast and jitter-free tracker by model-guided detection and matching] and [Y. Tsin, Y. Genc, Y. Zhu, and V. Ramesh. Learn to track edges. Accepted for Oral Presentation on the Eleventh IEEE International Conference on Computer Vision 2007 (ICCV'07), the disclosure of which is incorporated by reference herein in its entirety].

After the car has been best aligned with an image, we compute the distance from a model projection to the nearest image feature points. If the distance is smaller than a threshold, the model point is considered as accurate in terms of model and pose. The percentage of accurate model points is used as a geometric measure of how well the enrolled car matches with the observed car.

9. Geometric Re-Identification Using Additional Surface Markings

Surface markings other than that modeled by our ASM can also be used for re-identification of a car. For example, a car with a sunroof should be easily distinguished from a group of cars without a sunroof. Once the pose and model of a car is successfully estimated, we can always back project all surface markings to the 3D car model. Salient surface markings corresponding to long edges, such as side windows and sunroofs, can be added to the set of surface markings already described by the ASM. When we need to re-identify a car, these additional surface markings are treated in the same way as the surface markings in the ASM. They provide much stronger signatures for cars.

10. Strong Feature Descriptors for Re-Identification

Once the model and pose are known when we successfully enroll a car and later align it with observations in an input image, we can always warp the texture mapped 3D models to a canonical view. In the canonical view, two cars can be compared by using strong feature descriptors such as the scale-invariant feature transform (SIFT) feature descriptor. For instance, we can extract a SIFT descriptor from each image patch in a regular grid and compare corresponding descriptors between the model in a canonical view and the "car" to be re-identified in an input image. The benefit of using these strong feature descriptors is that they are insensitive to a small misalignment between the model and the image.

11. Sum of Squared Difference (SSD) for Re-Identification

Once the model and pose are known when we successfully enroll a car and later align it with observations in an input image, we can always warp the texture mapped 3D models to a canonical view. In the canonical view, two cars can be compared by using pixel by pixel color difference between the model and the input image. The advantage of such an approach is that it can be very fast and textureless regions can contribute to the matching scores as well.

12. Illumination Normalization for Re-Identification

The image from which the car model is built can have quite different colors from the image from which a car is to be re-identified due to different illumination and camera photometric characteristics. To remedy this problem, we propose to 1) photometrically calibrate each camera and compute a response curve for each channel: 2) when there is no motion detected (by background subtraction) in an input image, we estimate a 3×3 color transformation matrix that would change the scene to a canonical color; 3) when a car is to be enrolled/re-identified, the color transformation matrix as well as the response curves are stored as part of a car signature. Appearance comparison, either using SIFT or SSD, can be done after transforming image colors to a canonical color space.

Several methods according to an exemplary embodiment of the present invention will now be discussed.

Figure 19A:
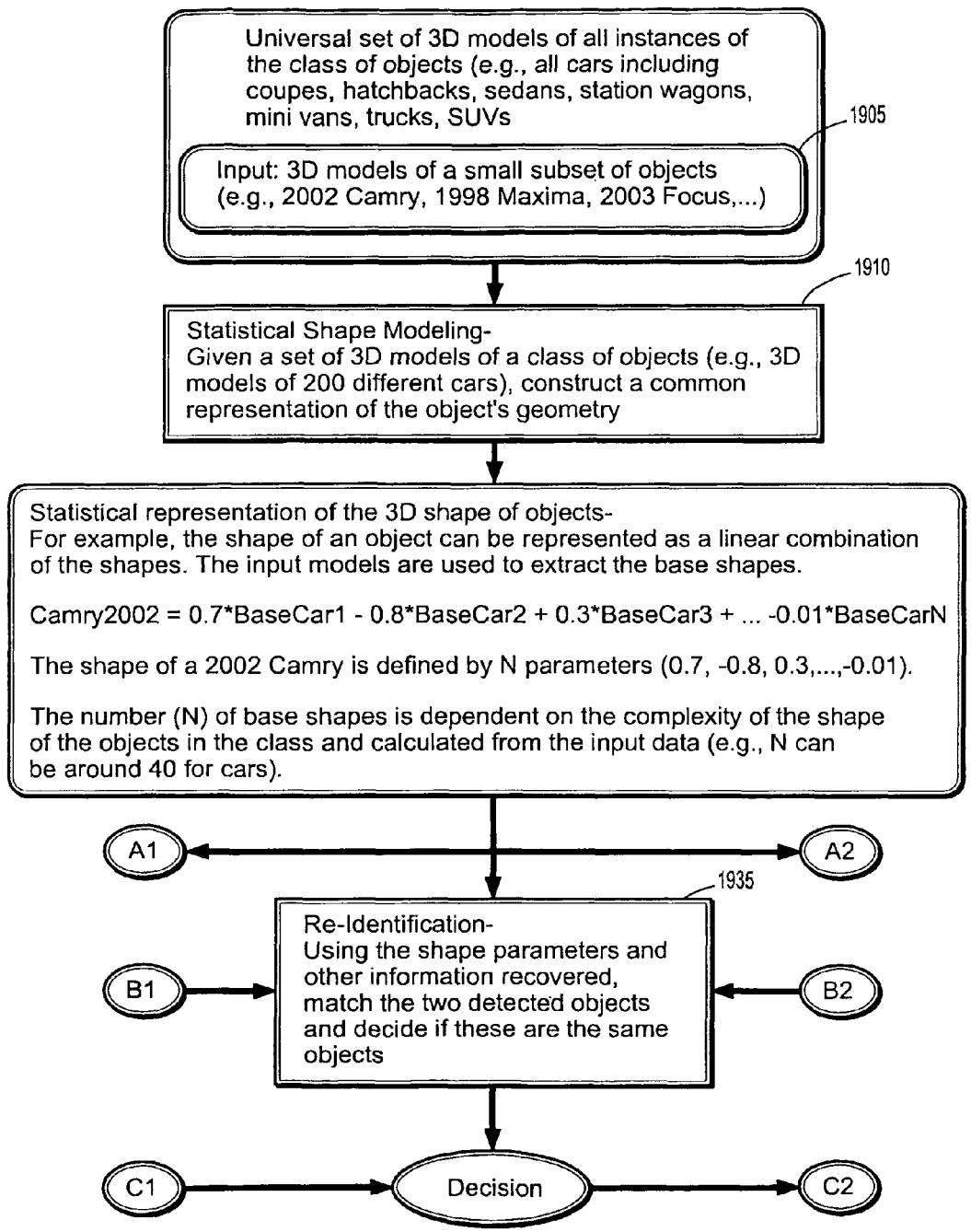
FIGS. 19A-C include a flowchart that illustrates several methods according to an exemplary embodiment of the present invention.

Referring now to FIG. 19A, there exists a universal set of 3D models of all instances of the class of objects (e.g., all cars including coupes, hatchbacks, sedans, station wagons, mini vans, trucks, SUVs). In step 1905, an input is received, that includes 3D models of a small subset of objects (e.g., 2002 Camry, 1998 Maxima, 2003 Focus, . . . ).

In step 1910, statistical shape modeling is performed. Here, given a set of 3D models of a class of objects (e.g., 3D models of 200 different cars), a common representation of the objects' geometry or a statistical representation of the 3D shape of the objects is constructed. The shape of an object is represented as a linear combination of base shapes (e.g., Camry 2002=0.7*BaseCar1−0.8*BaseCar2+0.3*BaseCar3+0.01*BaseCarN), for example.

Figure 19B:
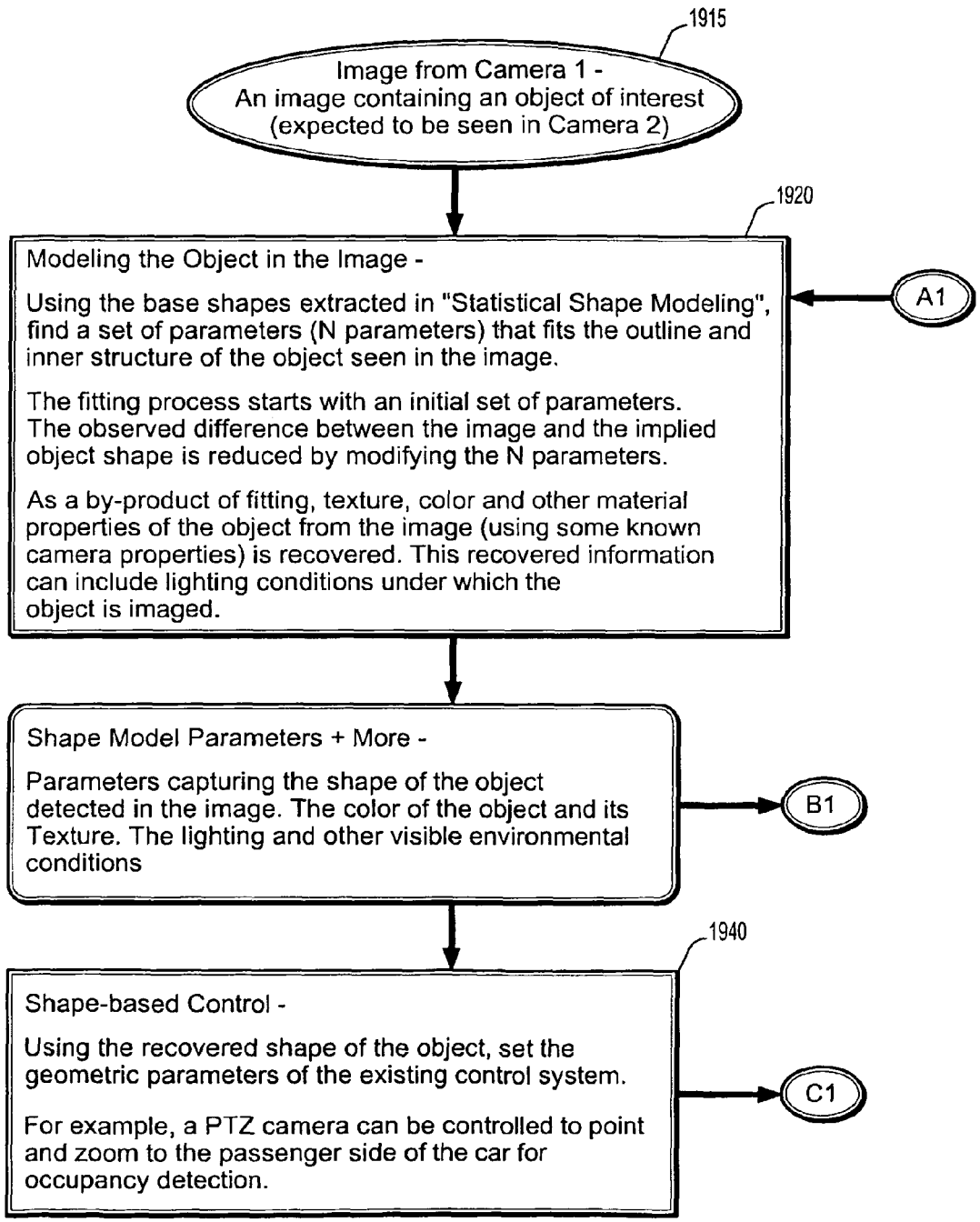

Referring now to FIG. 19B, in step 1915, an image that includes an object of interest is captured by a camera. In step 1920, the object in the image is modeled. This is done by using the base shapes extracted during step 1910 and finding a set of parameters (N parameters) that fits the outline and inner structure of the object in the image.

The fitting process starts with an initial set of parameters. The observed difference between the image and the implied object shape is reduced by modifying the N parameters.

As a by-product of fitting, texture, color and other material properties of the object in the image (using some known camera properties) is recovered. This recovered information can include the lighting conditions under which the object is imaged.

Figure 19C:
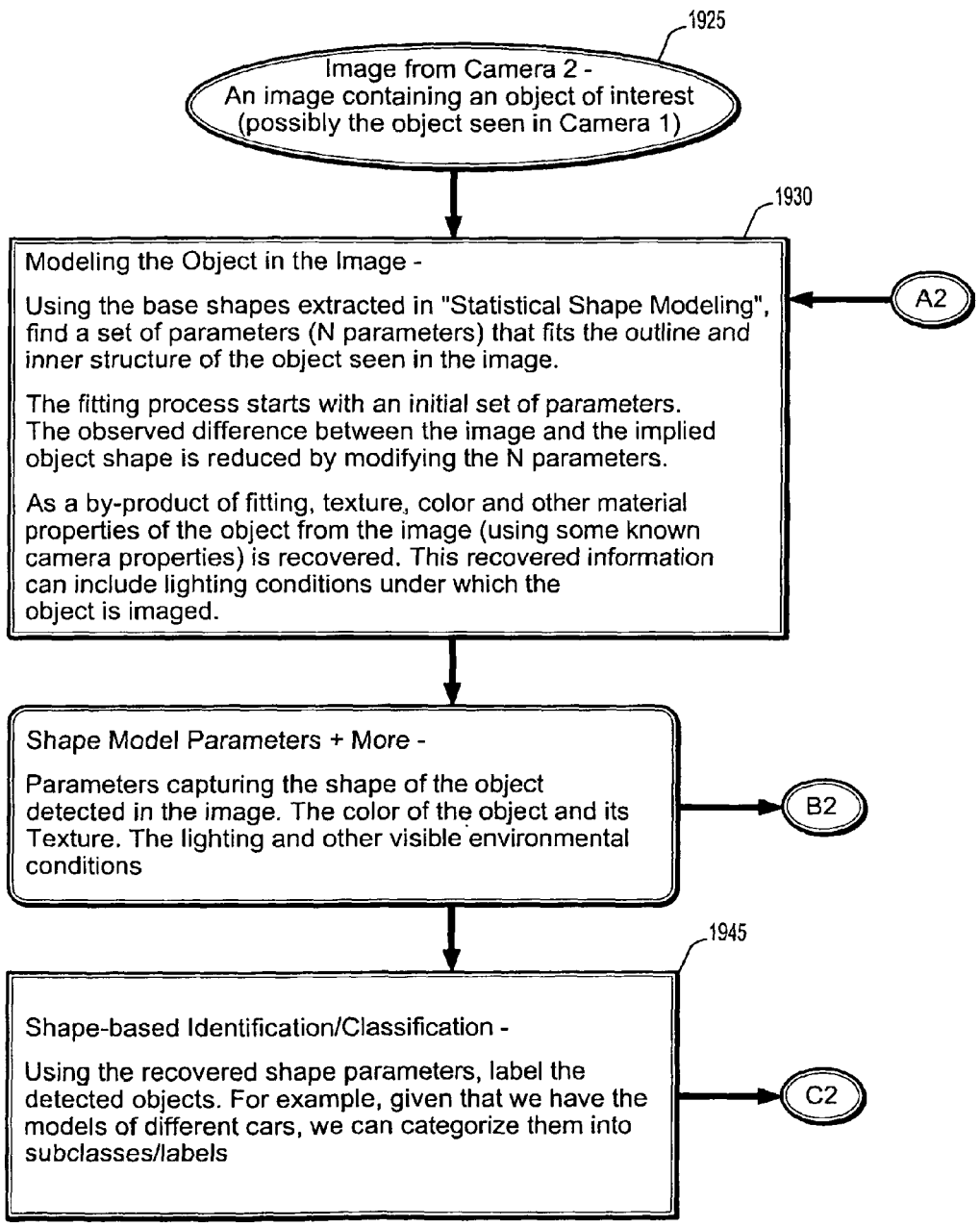

Referring now to FIG. 19C, in step 1925, an image that includes an object of interest is captured by a camera. In step 1930, the object in the image is modeled. Step 1930 is the same as step 1920.

Now the objects in the image have been modeled, in step 1935 shown in FIG. 19A, their respective shape parameters and other recovered information are matched to see if the two detected objects are the same.

In step 1940, using one model or both, shape-based control may be performed in which a PTZ camera can be controlled to point and zoom to the passenger side of a car for occupancy detection. This is possible because we know the location of the passenger side of the car from the initial model, we can thus communicate this to a second camera so that the second camera can be configured to capture a zoomed in shot of this area when the car passes by.

In step 1945, shape-based identification/classification can be performed by, labeling the detected objects. For example, given that we have two models of two different cars from our images we can categorize them into subclasses by labeling them as trucks, sedans, minivans, etc.

A system in which exemplary embodiments of the present invention may be implemented will now be described.

Figure 20:
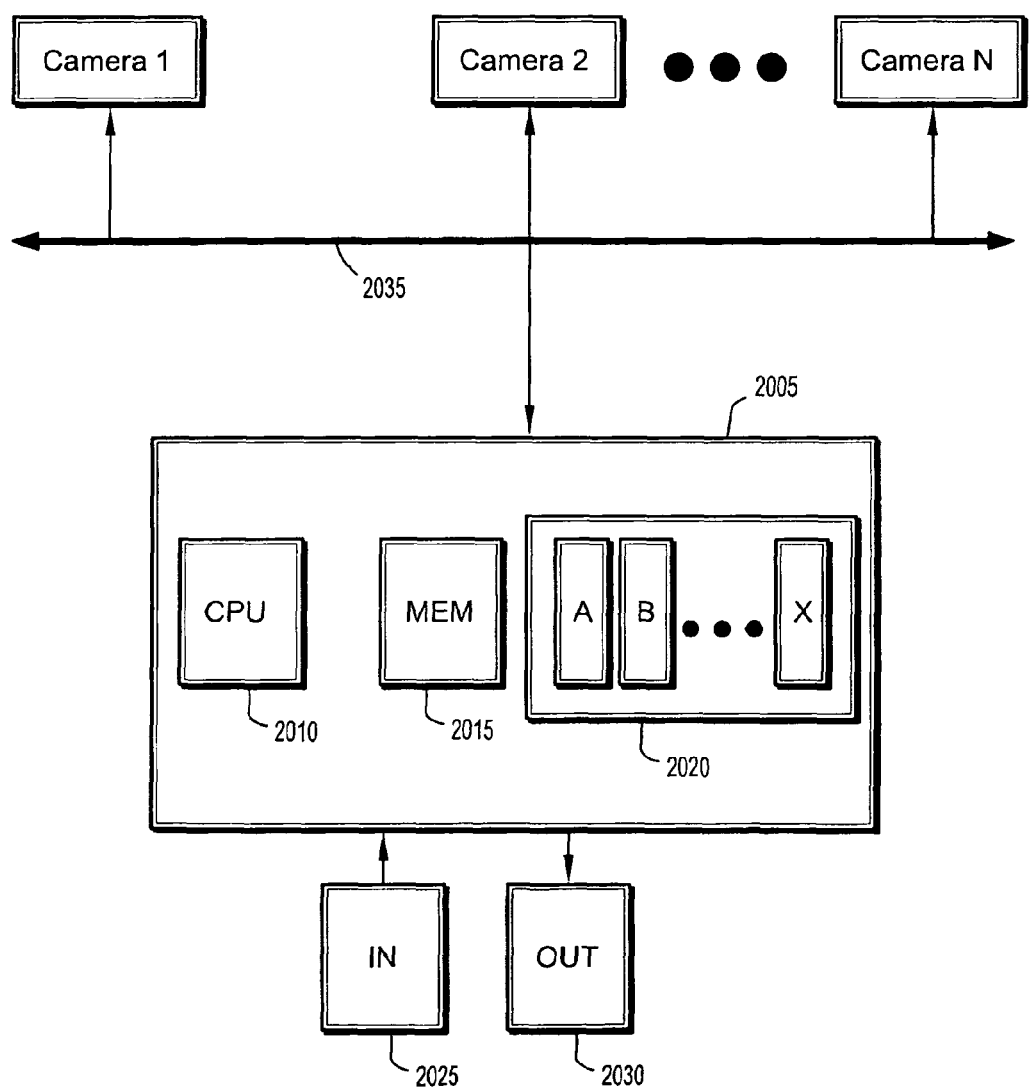
FIG. 20 is a block diagram of a system in which exemplary embodiments of the present invention may be implemented.

As shown in FIG. 20, a computer 2005, which may be a laptop computer, desktop computer or server, includes a central processing unit (CPU) 2010, a memory 2015 and a module or module set 2020 that includes program code for executing methods in accordance with exemplary embodiments of the present invention. The computer 2005 is coupled to input and output devices 2025 and 2030 and cameras (Camera 1, Camera 2, . . . , Camera N) via a network 2035.

The memory 2015 includes random access memory (RAM) and read only memory (ROM). The memory 2015 can also include a database, disk drive, tape drive or a combination thereof. The input 2025 is constituted by a keyboard or mouse and the output 2030 is constituted by a display or printer. The network 2035 may be a wired or wireless network, or the Internet, for example.

It is understood that the present invention may be implemented in various forms of hardware, software, firmware, special purpose processors, or a combination thereof. In one embodiment, the present invention may be implemented in software as an application program tangibly embodied on a program storage device (e.g., magnetic floppy disk, RAM, CD ROM, DVD, ROM, and flash memory). The application program may be uploaded to, and executed by, a machine comprising any suitable architecture.

It is also understood that because some of the constituent system components and method steps depicted in the accompanying figures may be implemented in software, the actual connections between the system components (or the process steps) may differ depending on the manner in which the present invention is programmed. Given the teachings of the present invention provided herein, one of ordinary skill in the art will be able to contemplate these and similar implementations or configurations of the present invention.

It is further understood that the above description is only representative of illustrative embodiments. For convenience of the reader, the above description has focused on a representative sample of possible embodiments, a sample that is illustrative of the principles of the invention. The description has not attempted to exhaustively enumerate all possible variations. That alternative embodiments may not have been presented for a specific portion of the invention, or that further undescribed alternatives may be available for a portion, is not to be considered a disclaimer of those alternate embodiments. Other applications and embodiments can be implemented without departing from the spirit and scope of the present invention.

It is therefore intended, that the invention not be limited to the specifically described embodiments, because numerous permutations and combinations of the above and implementations involving non-inventive substitutions for the above can be created, but the invention is to be defined in accordance with the claims that follow. It can be appreciated that many of those undescribed embodiments are within the literal scope of the following claims, and that others are equivalent.

What is claimed is:

1. A method for modeling a vehicle, comprising:
   receiving an image that includes a vehicle; and
   automatically constructing a three-dimensional (3D) model of the vehicle, wherein the 3D model is constructed by:
   (a) taking a predetermined set of base shapes that are extracted from a subset of vehicles, wherein 3D active shape models of the vehicles in the subset of vehicles are each defined by a combination of base shapes, and wherein the base shapes include surface markings and high curvature regions, the surface markings including a front windshield of a vehicle, rear window of the vehicle and side-bottom frame of the vehicle all of which are represented as 3D edge points in the active shape model, and the high curvature regions are represented as viewing direction dependent occluding contours of the vehicle;
   (b) multiplying each of the base shapes of the predetermined set by a parameter;
   (c) adding the resultant of each multiplication to form a vector that represents a shape of the vehicle in the image;
   (d) fitting the vector to the vehicle in the image; and
   (e) repeating steps (a)-(d) by modifying the parameters until a difference between the fit vector and the vehicle in the image is minimized, wherein a plurality of fit vectors form the outline of the vehicle in the image.

2. The method of claim 1, wherein the base shapes are extracted by applying principle component analysis to vectors of landmark points, wherein each vector of landmark points represents a vehicle in the subset.

3. The method of claim 1, wherein the parameter of (b) is a linear interpolation coefficient.

4. The method of claim 1, wherein the parameter of (b) is found using a search algorithm.

5. The method of claim 4, wherein the search algorithm is a gradient descent.

6. A method for re-identifying a vehicle, comprising:
   capturing an image that includes a first vehicle;
   automatically constructing a three-dimensional (3D) model of the vehicle, wherein the 3D model is constructed by:
   (a) taking a predetermined set of base shapes that are extracted from a subset of vehicles, wherein 3D active shape models of the vehicles in the subset of vehicles are each defined by a combination of base shapes, and wherein the base shapes include surface markings and high curvature regions, the surface markings including a front windshield of a vehicle, rear window of the vehicle and side-bottom frame of the vehicle all of which are represented as 3D edge points in the active shape model, and the high curvature regions are represented as viewing direction dependent occluding contours of the vehicle;
   (b) multiplying each of the base shapes of the predetermined set by a parameter;
   (c) adding the resultant of each multiplication to form a vector that represents a shape of the vehicle in the image;
   (d) fitting the vector to the vehicle in the image; and
   (e) repeating steps (a)-(d) by modifying the parameters until a difference between the fit vector and the vehicle in the image is minimized, wherein a plurality of fit vectors form the outline of the vehicle in the image;
   capturing an image that includes a second vehicle;
   constructing a 3D model of the second vehicle, wherein the 3D model of the second vehicle is constructed by performing steps (a)-(e); and
   determining if the 3D model of the first vehicle is the same as the 3D model of the second vehicle by comparing the 3D models to each other.

7. The method of claim 6, further comprising:
   extracting color information from the vehicles in the images; and
   applying the color information to the respective 3D models.

8. The method of claim 7, wherein the step of determining if the 3D model of the first vehicle is the same as the 3D model of the second vehicle further comprises:
   comparing the colored 3D models to each other.

9. The method of claim 7, further comprising:
   extracting environmental condition information of an area surrounding each of the vehicles in the images; and
   applying the environmental condition information to the respective colored 3D models.

10. The method of claim 9, wherein when the environmental condition information is different, the method further comprises:
    equalizing an effect of the environmental conditions on the colored 3D models.

11. The method of claim 6, further comprising:
    extracting texture information from the vehicles in the images; and
    applying the texture information to the respective 3D models.

12. The method of claim 11, wherein the step of determining if the 3D model of the first vehicle is the same as the 3D model of the second vehicle further comprises:
    comparing the textured 3D models to each other.

13. The method of claim 11, further comprising:
    extracting environmental condition information of an area surrounding each of the vehicles in the images; and
    applying the environmental condition information to the respective textured 3D models.

14. The method of claim 13, wherein when the environmental condition information is different, the method further comprises:
    equalizing an effect of the environmental conditions on the colored 3D models.

15. The method of claim 6, further comprising: categorizing the 3D models.

16. A method for performing shape based control, comprising:
    receiving an image that includes a vehicle; and automatically constructing a three-dimensional (3D) model of the vehicle, wherein the 3D model is constructed by:
(a) taking a predetermined set of base shapes that are extracted from a subset of vehicles, wherein 3D active shape models of the vehicles in the subset of vehicles are each defined by a combination of base shapes, and wherein the base shapes include surface markings and high curvature regions, the surface markings including a front windshield of a vehicle, rear window of the vehicle and side-bottom frame of the vehicle all of which are represented as 3D edge points in the active shape model, and the high curvature regions are represented as viewing direction dependent occluding contours of the vehicle;
(b) multiplying each of the base shapes of the predetermined set by a parameter;
(c) adding the resultant of each multiplication to form a vector that represents a shape of the vehicle in the image;
(d) fitting the vector to the vehicle in the image; and
(e) repeating steps (a)-(d) by modifying the parameters until a difference between the fit vector and the vehicle in the image is minimized, wherein a plurality of fit vectors form the outline of the vehicle in the image;
identifying a desired portion of the vehicle for further analysis; and
causing another image that includes the vehicle to be taken, wherein the image further includes an enhanced version of the desired portion.

17. The method of claim 16, wherein the images are captured from one or more than one camera.

18. A system for re-identifying a vehicle, comprising:
a first camera for capturing an image that includes a first vehicle;
a second camera for capturing an image that includes a second vehicle; and
a computer in communication with the cameras, the computer including a memory device for storing a program and a processor in communication with the memory device, the processor operative with the program to:
receive the image that includes the first vehicle;
automatically construct a three-dimensional (3D) model of the vehicle, wherein the 3D model is constructed by:
(a) taking a predetermined set of base shapes that are extracted from a subset of vehicles, wherein 3D active shape models of the vehicles in the subset of vehicles are each defined by a combination of base shapes, and wherein the base shapes include surface markings and high curvature regions, the surface markings including a front windshield of a vehicle, rear window of the vehicle and side-bottom frame of the vehicle all of which are represented as 3D edge points in the active shape model, and the high curvature regions are represented as viewing direction dependent occluding contours of the vehicle;
(b) multiplying each of the base shapes of the predetermined set by a parameter;
(c) adding the resultant of each multiplication to form a vector that represents a shape of the vehicle in the image;
(d) fitting the vector to the vehicle in the image; and
(e) repeating steps (a)-(d) by modifying the parameters until a difference between the fit vector and the vehicle in the image is minimized, wherein a plurality of fit vectors form the outline of the vehicle in the image;
receive the image that includes the second vehicle;
construct a 3D model of the second vehicle, wherein the 3D model of the second vehicle is constructed by performing steps (a)-(e); and
determine if the 3D model of the first vehicle is the same as the 3D model of the second vehicle by comparing the parameters of the 3D models to each other.

19. The system of claim 8 wherein the first and second cameras are in different locations.

20. The system of claim 18, wherein the first and second cameras communicate with the computer over a wired or wireless network.

21. A non-transitory computer readable storage medium storing instructions that, when executed by a computer, cause the computer to perform a method for modeling a vehicle, the method comprising:
receiving an image that includes a vehicle; and
automatically constructing a three-dimensional (3D) model of the vehicle, wherein the 3D model is constructed by:
(a) taking a predetermined set of base shapes that are extracted from a subset of vehicles, wherein 3D active shape models of the vehicles in the subset of vehicles are each defined by a combination of base shapes, and wherein the base shapes include surface markings and high curvature regions, the surface markings including a front windshield of a vehicle, rear window of the vehicle and side-bottom frame of the vehicle all of which are represented as 3D edge points in the active shape model, and the high curvature regions are represented as viewing direction dependent occluding contours of the vehicle;
(b) multiplying each of the base shapes of the predetermined set by a parameter;
(c) adding the resultant of each multiplication to form a vector that represents a shape of the vehicle in the image;
(d) fitting the vector to the vehicle in the image; and
(e) repeating steps (a)-(d) by modifying the parameters until a difference between the fit vector and the vehicle in the image is minimized, wherein a plurality of fit vectors form the outline of the vehicle in the image.

* * * * *